(12) United States Patent
Hsueh et al.

(10) Patent No.: US 12,512,363 B2
(45) Date of Patent: Dec. 30, 2025

(54) FORMING INTERCONNECT STRUCTURES IN SEMICONDUCTOR DEVICES

(71) Applicant: Taiwan Semiconductor Manufacturing Company, Ltd., Hsin-Chu (TW)

(72) Inventors: Hsiu-Wen Hsueh, Taichung (TW); Cai-Ling Wu, Hsinchu (TW); Chii-Ping Chen, Hsinchu (TW); Chien-Chih Chiu, Tainan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 687 days.

(21) Appl. No.: 17/460,764

(22) Filed: Aug. 30, 2021

(65) Prior Publication Data

US 2023/0060269 A1 Mar. 2, 2023

(51) Int. Cl.
*H01L 21/768* (2006.01)
*H01L 23/522* (2006.01)

(52) U.S. Cl.
CPC .... *H01L 21/7681* (2013.01); *H01L 21/76832* (2013.01); *H01L 21/76897* (2013.01); *H01L 23/5226* (2013.01); *H01L 21/76802* (2013.01); *H01L 21/76816* (2013.01); *H01L 21/76831* (2013.01); *H01L 21/76834* (2013.01); *H01L 21/76837* (2013.01); *H01L 21/76843* (2013.01); *H01L 21/76877* (2013.01); *H01L 21/7688* (2013.01); *H01L 21/76885* (2013.01)

(58) Field of Classification Search
CPC ......... H01L 21/76832; H01L 21/76885; H01L 21/76897; H01L 21/76837; H01L 21/7688; H01L 21/76802; H01L 21/76816; H01L 21/76877; H01L 21/73802
See application file for complete search history.

(56) References Cited

U.S. PATENT DOCUMENTS

| | | | | |
|---|---|---|---|---|
| 5,851,913 A * | 12/1998 | Brennan | ........... | H01L 21/76807 438/622 |
| 6,297,162 B1 * | 10/2001 | Jang | ................ | H01L 21/3145 257/E21.507 |
| 6,358,839 B1 * | 3/2002 | Li | ................ | H01L 21/76807 438/669 |

(Continued)

*Primary Examiner* — David A Zarneke
(74) *Attorney, Agent, or Firm* — HAYNES AND BOONE, LLP

(57) ABSTRACT

A method includes forming a first conductive feature over a substrate, forming an etch-stop layer (ESL) stack over the first conductive feature, forming a first interlayer dielectric (ILD) layer over the ESL stack, forming a patterned ESL having a first opening over the first ILD layer, forming a second ILD layer over the patterned ESL, thereby filling the first opening, forming a patterned HM having a second opening over the second ILD layer, where a width of the second opening is greater than a width of the first opening, performing an etching process to form a first trench in the second ILD layer and a second trench in the first ILD layer, where the second trench exposes the first conductive feature, and subsequently depositing a conductive layer in the first trench and the second trench, thereby forming a second conductive feature interconnecting a third conductive to the first conductive feature.

20 Claims, 19 Drawing Sheets

(56) References Cited

U.S. PATENT DOCUMENTS

| | | | | |
|---|---|---|---|---|
| 6,455,417 | B1* | 9/2002 | Bao | H01L 21/0217 |
| | | | | 257/E21.293 |
| 6,600,207 | B2* | 7/2003 | Huang | H01L 21/76852 |
| | | | | 257/E21.589 |
| 6,635,576 | B1* | 10/2003 | Liu | H01L 21/76804 |
| | | | | 257/E21.252 |
| 6,677,679 | B1* | 1/2004 | You | H01L 21/76831 |
| | | | | 438/622 |
| 6,734,116 | B2* | 5/2004 | Guo | H01L 21/31116 |
| | | | | 257/E21.252 |
| 6,879,046 | B2* | 4/2005 | Gibson, Jr. | H01L 21/76829 |
| | | | | 428/428 |
| 6,890,817 | B2* | 5/2005 | Maeda | H01L 21/76805 |
| | | | | 438/254 |
| 7,507,662 | B2* | 3/2009 | Fukada | H01L 21/76816 |
| | | | | 438/668 |
| 9,129,965 | B2* | 9/2015 | Sung | H01L 21/76802 |
| 10,199,325 | B2* | 2/2019 | Yim | H01L 21/76897 |
| 10,886,176 | B2* | 1/2021 | Kikuchi | H01L 21/76897 |
| 11,004,740 | B2* | 5/2021 | Yang | H01L 23/53295 |
| 11,139,244 | B2* | 10/2021 | Lee | H01L 21/76843 |
| 11,362,030 | B2* | 6/2022 | Dai | H01L 21/76885 |
| 11,676,862 | B2* | 6/2023 | Chu | H01L 21/76829 |
| | | | | 257/774 |
| 11,837,548 | B2* | 12/2023 | Kim | H01L 23/5226 |
| 12,132,000 | B2* | 10/2024 | Lee | H10D 30/6757 |
| 12,218,003 | B2* | 2/2025 | Penny | H01L 21/76834 |
| 12,388,008 | B2* | 8/2025 | Su | H01L 21/76832 |
| 2005/0077595 | A1* | 4/2005 | Huang | H01L 23/5329 |
| | | | | 257/532 |
| 2005/0202685 | A1* | 9/2005 | Huang | H01L 21/02304 |
| | | | | 257/E21.579 |
| 2007/0032062 | A1* | 2/2007 | Lee | H01L 21/76807 |
| | | | | 438/597 |
| 2019/0304903 | A1* | 10/2019 | You | H01L 21/76834 |
| 2021/0265208 | A1* | 8/2021 | Yang | H01L 21/76897 |
| 2022/0262738 | A1* | 8/2022 | Lee | H01L 23/53266 |
| 2022/0384340 | A1* | 12/2022 | Shin | H01L 21/76897 |
| 2023/0016977 | A1* | 1/2023 | Clevenger | H01L 23/5283 |

\* cited by examiner

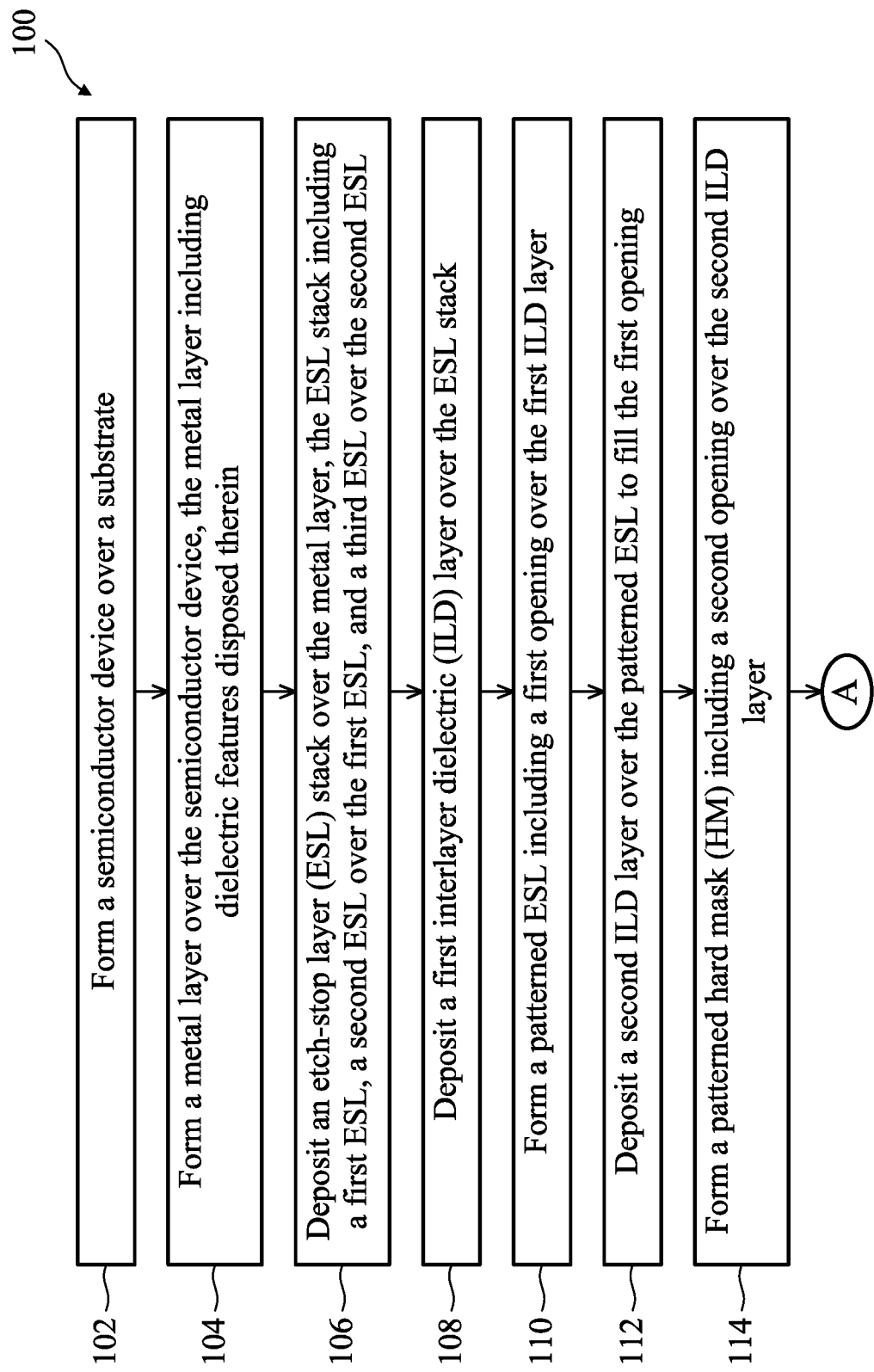

FORMING INTERCONNECT STRUCTURES IN SEMICONDUCTOR DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As a part of the semiconductor fabrication, conductive features are formed to provide electrical interconnections for the various components of an IC. For example, metal lines and via contacts connecting various metal lines may be formed by etching openings in a dielectric material layer and filling the openings with a conductive material. However, as semiconductor fabrication technology nodes continue to evolve toward smaller critical dimensions and pitches, challenges arise with respect to achieving desired feature profiles without compromising device performance. Therefore, while processes for interconnect structure formation have generally been adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A and 1B illustrate a flow chart of a method for forming an interconnect structure over semiconductor device according to various embodiments of the present disclosure.

DETAILED DESCRIPTION

Figure 1B:
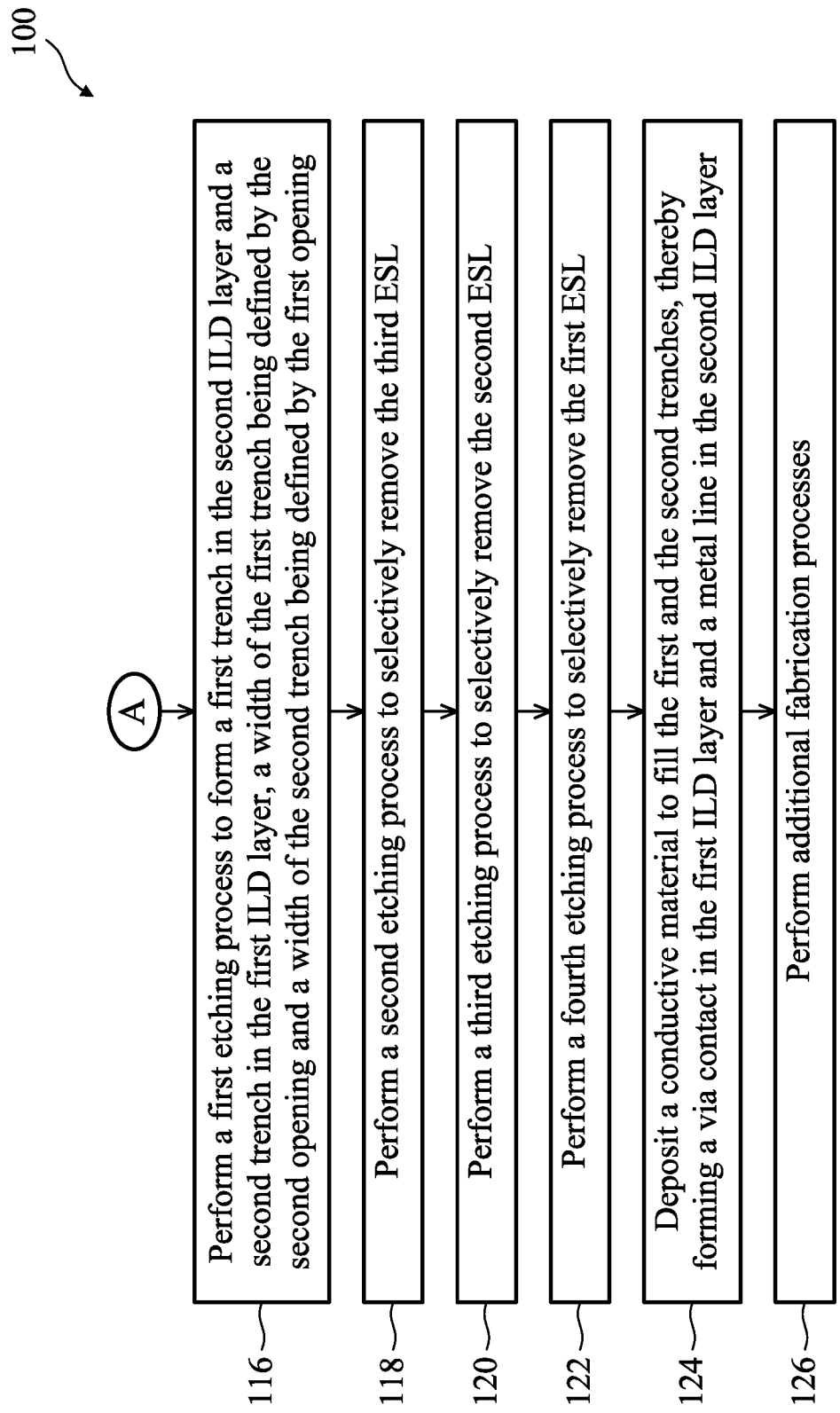

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to interconnect structures in ICs. An integrated circuit (IC) contains a plurality of patterned metal lines separated by inter-wiring spacings. Metal lines formed in trench-like openings typically extend substantially parallel to the semiconductor substrate. Semiconductor devices of such type, according to current technology, may comprise eight or more levels of metallization layers to satisfy device geometry and microminiaturization requirements. As a part of semiconductor fabrication, electrical interconnections need to be formed to electrically interconnect the various metallization layers, as well as other microelectronic elements (e.g., source/drain, gate, etc.), of a semiconductor device. Generally, this involves forming openings in layers (such as in electrically insulating layers), and subsequently filling these openings with an electrically conductive material. The electrically conductive material is then polished to form the electrical interconnections such as metal lines or via contacts.

FIGS. 1A and 1B illustrate a flow chart of a method 100, constructed according to various aspects of the present disclosure. Method 100 is an example and is not intended to limit the present disclosure beyond what is explicitly recited in the claims. Additional operations can be provided before, during, and after method 100, and some operations described can be replaced, eliminated, or relocated for additional embodiments of method 100. The method 100 is described below in conjunction with FIGS. 2-17, which graphically illustrate some principles of method 100. FIGS. 2-17 illustrate cross-sectional views of an example IC semiconductor device 10 (hereafter referred to as IC device 10) during various fabrication stages of method 100 in accordance with some embodiments.

Figure 2:
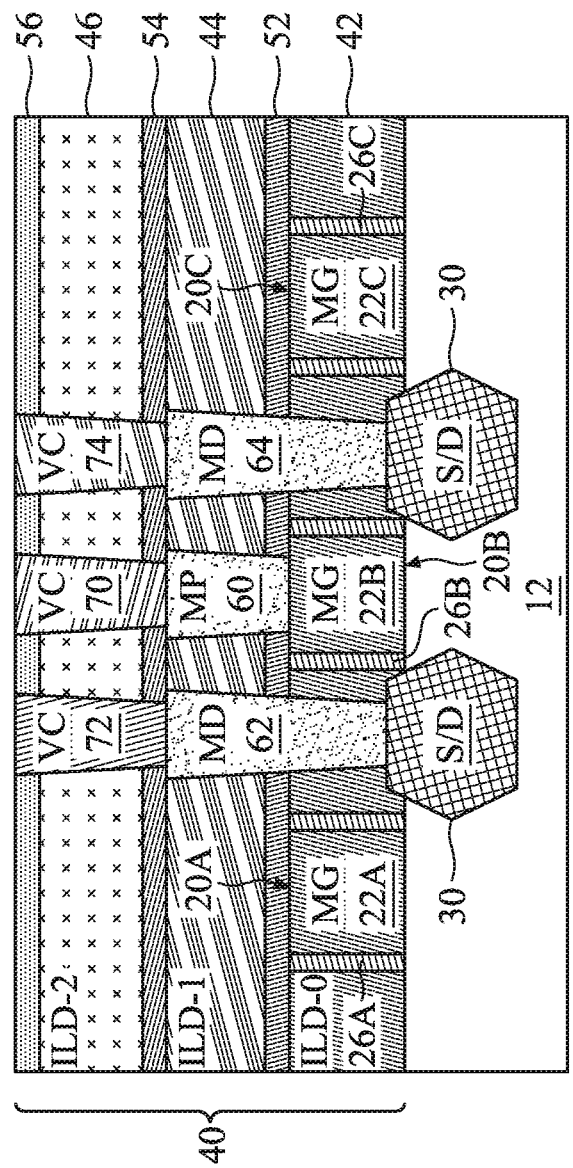
FIGS. 2, 3A, 3B, 4, 5, 6, 7, 8, 9, 10, 11, 12, 13, 14, 15, 16, and 17 are cross-sectional views of a portion of the interconnect structure at various fabrication stages of the method depicted in FIGS. 1A and 1B according to various embodiments of the present disclosure.

Referring to FIGS. 1A and 2, method 100 begins at operation 102 by forming a portion of IC device 10 as illustrated in FIG. 2, which is a fragmentary diagrammatic view of an integrated circuit device 10, in portion or entirety, according to various aspects of the present disclosure. IC device 10 may be included in a microprocessor, a memory, and/or other integrated circuit device. In some implementations, IC device 10 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs) or nanosheet FETs (NS FETs, which may be alternatively referred to as gate-all-around, or GAA, FETs). FIG. 2 has been simplified for the sake of clarity to better understand the inventive concepts of the present disclosure. Additional features may be added in IC device 10, and some of the features described below may be replaced, modified, or eliminated in other embodiments of IC device 10.

IC device 10 includes a substrate (e.g., a wafer) 12. In the depicted embodiment, substrate 12 includes silicon. Alternatively or additionally, substrate 12 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods.

Substrate 12 may include various doped regions (not shown) depending on design requirements of integrated circuit device 10. In some implementations, substrate 12 includes p-type doped regions (for example, p-type wells) doped with p-type dopants, such as boron (for example, $BF_2$), indium, other p-type dopant, or combinations thereof. The various doped regions may be formed directly on and/or in substrate 12, for example, providing a p-well structure, an n-well structure, a dual-well structure, a raised structure, or combinations thereof. An ion implantation process, a diffusion process, other suitable doping process, or combinations thereof may be performed to form the various doped regions. In some examples, substrate 12 may be a three-dimensional fin structure (i.e., substrate 12 may be alternatively referred to as fin structure 12 and FIG. 2 illustrates a cross-sectional view of the fin structure 12 along a fin length) including one or more semiconductor materials provided herein and may further include doped regions as discussed above.

An isolation feature(s) (not shown) is formed over and/or in substrate 12 to isolate various regions, such as various device regions, of integrated circuit device 10. For example, isolation features define and electrically isolate active device regions and/or passive device regions from each other. Isolation features may include silicon oxide, a low-k dielectric material, other suitable isolation material, or combinations thereof. Isolation features may include different structures, such as shallow trench isolation (STI) structures, deep trench isolation (DTI) structures, and/or local oxidation of silicon (LOCOS) structures. In some implementations, isolation features include STI features, which may be formed by etching a trench in substrate 12 (for example, by using a dry etch process and/or wet etch process) and filling the trench with insulator material (for example, by using a chemical vapor deposition (CVD) process or a spin-on glass process). A chemical mechanical polishing (CMP) process may be performed to remove excessive insulator material and/or planarize a top surface of isolation features.

Various gate structures are disposed over substrate 12, such as a gate structure 20A, a gate structure 20B, and a gate structure 20C. In some implementations, one or more of gate structures 20A-20C interpose a source region and a drain region, where a channel region is defined between the source region and the drain region. The one or more gate structures 20A-20C engage the channel region, such that current may flow between the source/drain regions during operation. In some implementations, gate structures 20A-20C are formed over a fin structure (e.g., fin structure 12), such that gate structures 20A-20C each wrap a channel region of the fin structure, thereby interposing a source region and a drain region of the fin structure.

Gate structures 20A-20C include metal gate (MG) stacks, such as a metal gate stack 22A, a metal gate stack 22B, and a metal gate stack 22C. In some implementations, metal gate stacks 22A-22C include a gate dielectric (for example, a gate dielectric layer; not shown) and a gate electrode (for example, a work function layer and a conductive bulk layer; not shown). Metal gate stacks 22A-22C may include numerous other layers, for example, capping layers, interface layers, diffusion layers, barrier layers, hard mask layers, or combinations thereof. In some implementations, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, the gate dielectric layer is a high-k dielectric layer (having a dielectric constant greater than that of silicon oxide). The gate electrode may include a bulk conductive layer formed over one or more work function layers. In some implementations, the work function layer is a conductive layer tuned to have a desired work function (such as an n-type work function or a p-type work function) and includes one or more work function materials such as titanium (Ti), silver (Ag), manganese (Mn), zirconium (Zr), TaAl, TaAlC, TiAlN, TaC, TaCN, TaSiN, molybdenum (Mo), aluminum (Al), ruthenium (Ru), TiN, TaN, WN, $ZrSi_2$, $MoSi_2$, $TaSi_2$, $NiSi_2$, other suitable work function materials, or combinations thereof. The bulk (or fill) conductive layer may include a suitable conductive material, such as Al, tungsten (W), Ru, cobalt (Co), copper (Cu), other suitable conductive materials, or combinations thereof. For embodiments in which an NS FET is provided in IC device 10 (not depicted), one or more of gate structures 20A-20C include a bottom portion that is interleaved with multiple semiconductor layers in the fin structure 12 and a top portion that is disposed over the fin structure 12.

Gate structures 20A-20C may be formed by deposition processes, lithography processes, etching processes, other suitable processes, or combinations thereof. The deposition processes may include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atmospheric pressure CVD (APCVD), electroplating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof.

The etching processes may include dry etching processes, wet etching processes, other etching processes, or combinations thereof.

Metal gate stacks 22A-22C may be fabricated according to a gate-last process, a gate-first process, or a hybrid gate-last/gate-first process. In gate-last process implementations, gate structures 20A-20D include dummy gate stacks that are subsequently replaced with metal gate stacks 22A-22C. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which metal gate stacks 22A-22C are formed.

Gate structures 20A-20C may further include spacers 26A-26C, which are disposed along sidewalls of metal gate stacks 22A-22C, respectively. Spacers 26A-26C may be formed by any suitable process and include a dielectric material comprising silicon, oxygen, carbon, nitrogen, other suitable material, or combinations thereof (for example, silicon oxide, silicon nitride, silicon oxynitride, or silicon carbide). In some implementations, spacers 26A-26C include a multi-layer structure, such as a first dielectric layer that includes silicon oxide and a second dielectric layer that includes silicon nitride. Implantation, diffusion, and/or annealing processes may be performed to form lightly doped source and drain (LDD) features and/or heavily doped source and drain (HDD) features in substrate 12 before and/or after forming spacers 26A-26C, depending on design requirements of integrated circuit device 10.

Epitaxial source features and epitaxial drain features (referred to as epitaxial source/drain features) are disposed in source/drain regions of substrate 12. For example, a semiconductor material is epitaxially grown on substrate 12, forming epitaxial source/drain features 30 over a source region and a drain region of substrate 12. In the depicted embodiment, gate structure 20B interposes epitaxial source/drain features 30, and a channel region is defined between epitaxial source/drain features 30. Gate structure 20B and epitaxial source/drain features 30 thus form a portion of a transistor, such a pull-up transistor or a pull-down transistor, of integrated circuit device 10. Gate structure 20B and/or epitaxial source/drain features 30 are thus alternatively referred to as device features.

In some implementations, epitaxial source/drain features 30 wrap source/drain regions of a fin structure. An epitaxy process may implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process may use gaseous and/or liquid precursors, which interact with the composition of substrate 12. Epitaxial source/drain features 30 are doped with n-type dopants and/or p-type dopants. In some implementations, where integrated circuit device 10 is configured as an n-type device (for example, having an n-channel), epitaxial source/drain features 30 are epitaxial layers containing silicon and/or carbon doped with phosphorous, arsenic, other n-type dopants, or combinations thereof. In some implementations, where integrated circuit device 10 is configured as a p-type device (for example, having a p-channel), epitaxial source/drain features 30 are epitaxial layers containing silicon and germanium doped with boron, other p-type dopants, or combinations thereof. In some implementations, epitaxial source/drain features 30 are doped by an ion implantation process subsequent to a deposition process. In some implementations, annealing processes are performed to activate dopants in epitaxial source/drain features 30 and/or other source/drain regions of integrated circuit device 10 (for example, HDD regions and/or LDD regions).

A multilayer interconnect (MLI) feature 40 is disposed over substrate 12. MLI feature 40 electrically couples various devices (for example, transistors, resistors, capacitors, and/or inductors) and/or components (for example, gate structures and/or source/drain features) of integrated circuit device 10, such that the various devices and/or components may operate as specified by design requirements of integrated circuit device 10. MLI feature 40 includes a combination of dielectric layers and conductive layers configured to form various interconnect structures. The conductive layers are configured to form vertical interconnect features, such as device-level contacts, vertical interconnect features, such as vias, and/or horizontal interconnect features, such as conductive lines. Vertical interconnect features typically connect horizontal interconnect features in different layers (or different planes) of MLI feature 40. During operation of integrated circuit device 10, the interconnect structures are configured to route signals between the devices and/or the components of integrated circuit device 10 and/or distribute signals (for example, clock signals, voltage signals, and/or ground signals) to the devices and/or the components of integrated circuit device 10. It is noted that though MLI feature 40 is depicted with a given number of dielectric layers and conductive layers, the present disclosure contemplates MLI feature 40 having more or less dielectric layers and/or conductive layers depending on design requirements of integrated circuit device 10.

As depicted in FIG. 2, MLI feature 40 includes one or more dielectric layers, such as an interlayer dielectric (ILD) layer 42 (ILD-0) disposed over substrate 12, an ILD layer 44 (ILD-1) disposed over ILD layer 42, and an ILD layer 46 (ILD-2) disposed over ILD layer 44. In some embodiments, ILD layers 44 and 46 are alternatively referred to as intermetal dielectric (IMD) layers. ILD layers 42-46 may each include a dielectric material such as, for example, silicon oxide, a low-k dielectric material, tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric material, or combinations thereof. In the depicted embodiment, ILD layers 42-46 include a low-k dielectric material (generally referred to as low-k dielectric layers). ILD layers 42-46 may include a multilayer structure having multiple dielectric materials. ILD layers 42-46 may be formed by any suitable method, such as CVD, FCVD, spin-on coating, other methods, or combinations thereof. In some implementations, ILD layers 42-46 are formed by an FCVD process that includes, for example, depositing a flowable material (such as silicon oxide) over substrate 12 and converting or hardening the flowable material to a solid material by a suitable technique, such as thermal annealing and/or ultraviolet radiation treating.

MLI feature 40 may further include one or more etch stop layers (ESL) disposed over substrate 12, such as an ESL 52 disposed between ILD layer 42 and ILD layer 44, an ESL 54 disposed between ILD layer 44 and ILD layer 46, and an ESL 56 disposed over ILD layer 46. In some implementations, an ESL (not shown) is also disposed between substrate 12 and ILD layer 42. ESLs 52-56 contain a dielectric material different from compositions of ILD layers 42-46. In some embodiments, ESLs 52-56 include silicon, nitrogen, oxygen, carbon, aluminum, titanium, tungsten, tantalum, other suitable materials, or combinations thereof. For example, ESLs 52-56 may include silicon nitride, aluminum nitride, aluminum oxynitride, titanium nitride, tungsten nitride, other suitable materials, or combinations thereof. In some embodiments, ESLs 52-56 each include multiple layers of dielectric materials. ESLs 52-56 may be formed over substrate 12 by, for example, a deposition process, such as CVD, PVD, ALD, other suitable methods, or combinations thereof. Subsequent to the deposition of ILD layers 42-46 and/or ESLs 52-56, a CMP process and/or other planarization process is performed, such that ILD layers 42-46 and/or ESLs 52-56 have substantially planar surfaces.

A device-level contact (MP) 60, a device-level contact (MD) 62, a device-level contact (MD) 64, a via contact (VC) 70, a VC 72, and a VC 74 are disposed in ILD layers 42-46 to form interconnect structures. Device-level contacts 60-64 (also referred to as local interconnects or local contacts) electrically couple and/or physically couple IC device features to other conductive features of MLI feature 40. For example, MP 60 is a metal-to-poly (MP) contact, which generally refers to a contact to a gate structure, such as a poly gate structure or a metal gate structure. In the depicted embodiment, MP 60 is disposed on gate structure 20B (in particular, metal gate stack 22B), such that MP 60 connects gate structure 20B to VC 70. M P 60 extends through ILD layer 44 and ESL 52, though the present disclosure contemplates embodiments where MP 60 extends through more than one ILD layer and/or ESL of MLI feature 40. In furtherance of the example, device-level contact 62 and device-level contact 64 are metal-to-device (MD) contacts, which generally refer to contacts to a conductive region of integrated circuit device 10, such as source/drain regions. In the depicted embodiment, MDs 62 and 64 are disposed on respective epitaxial source/drain features 30, such that MDs 62 and 64 connect epitaxial source/drain features 30 to VCs 72 and 74, respectively. MDs 62 and 64 extend through ILD layer 42, ILD layer 44, and ESL 52, though the present disclosure contemplates embodiments where MD 62 and/or MD 64 extend through more than one ILD layer and/or ESL of MLI feature 40. In some implementations, device-level contacts 60-64 are middle-end-of-line (MEOL) conductive features that interconnect front-end-of-line (FEOL) conductive features (for example, gate structures 20A-20C and/or epitaxial source/drain features 30) to back-end-of-line (BEOL) conductive features (for example, VCs 70-74), thereby electrically and/or physically coupling FEOL conductive features to BEOL conductive features.

Via contacts, such as VCs 70-74, electrically couple and/or physically couple conductive features of MLI feature 40 to one another. For example, referring to FIGS. 2 and 3 collectively, VC 70 is disposed on MP 60, such that VC 70 connects MP 60 to conductive line (alternatively referred to as metal line) 80C; VC 72 is disposed on MD 62, such that VC 72 connects MD 62 to conductive line 80B; and VC 74 is disposed on MD 64, such that VC 74 connects MD 64 to conductive line 80D, where conductive lines 80B-80D (as well as 80A and 80E) are formed in a metal layer 80 and separated by dielectric features 82, as discussed in detail below. In the depicted embodiment, VCs 70-74 extend through ILD layer 46 and ESL 54 to contact device-level contacts 60-64, respectively, though the present disclosure contemplates embodiments where VCs 70-74 extend through more than one ILD layer and/or ESL of MLI feature 40. In some implementations, VCs 70-74 are BEOL conductive features that interconnect MEOL conductive features (for example, device-level contacts 60-64) to BEOL conductive features (for example, conductive lines 80A-80E), thereby electrically and/or physically coupling MEOL conductive features to BEOL conductive features. Device-level contacts 60-64 and VCs 70-74 may include any suitable conductive material, such as Co, Ru, Cu, Al, W, other suitable conductive materials, or combinations thereof.

Device-level contacts 60-64 and VCs 70-74 may be formed by a series of lithography patterning and etching processes similar to those discussed in detail above with respect to forming gate structures 20A-20C. For example, a patterned masking element including multiple openings may be formed over ILD layer 44 and used as an etch mask to transfer the openings to ILD layer 44, ESL 52, and/or ILD layer 42 via one or more etching processes. A conductive material may then be deposited in the openings using any suitable deposition method such as CVD, PVD, plating, other suitable methods, or combinations thereof, and subsequently planarized, thereby forming device-level contacts 60-64. Similarly, VCs 70-74 may be formed by patterning and etching ILD layer 46, ESL 54, and/or ESL 56 to form openings that expose the device-level contacts 60-64, and subsequently depositing and planarizing a conductive material in the openings to form VCs 70-74.

Figure 3A:
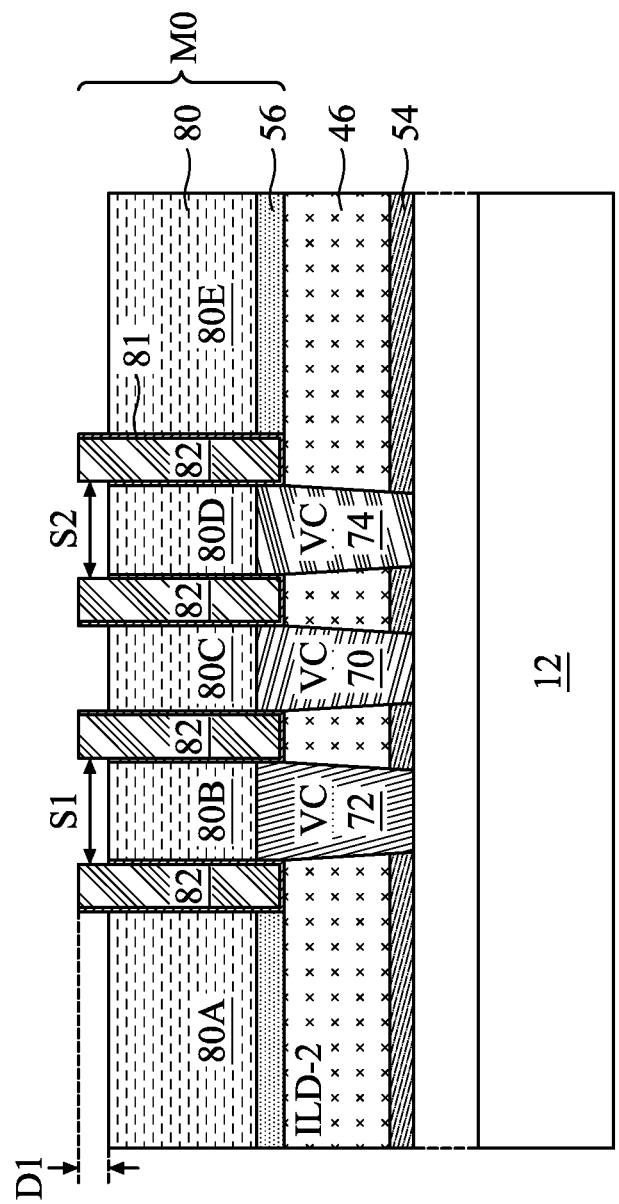

Referring to FIGS. 1A and 3A, method 100 at operation 104 proceeds to forming metal layer 80 over ESL 56 (thus over VCs 70-74), where metal layer 80 includes multiple metal lines 80A-80E separated by dielectric features 82 as discussed above. In some embodiments, metal layer 80 includes a noble metal such as, for example, Ru, iridium (Ir), rhodium (Rh), platinum (Pt), palladium (Pd), osmium (Os), Ag, and gold (Au). In some embodiments, metal layer 80 includes an aforementioned noble metal alloyed with noble or non-noble metals, such as PtIr, PdPt, or PdNi. Unlike some non-noble metals (e.g., Cu) that may not be suitable for direct patterning, noble metals can be patterned to form metal lines with a critical dimension (CD) of less than about 20 nm due to the suitability of being directly patterned in dry etching approaches (e.g., a reactive ion etching, or RIE, process). In some embodiments, composition of metal layer 80 is not limited to noble metals and may include non-noble metals such as Co, Mo, and/or W, as long as the metal is suitable for direct patterning. Metal layer 80 may be deposited by any suitable method, including CVD, PVD, electroplating, other suitable methods, or combinations thereof. Metal layer 80 may be formed to a thickness of about 250 Å to about 350 Å, such as about 300 Å.

In addition to serving as an etch-stop layer by providing end-point control during subsequent etching processes, ESL 56 may additionally improve adhesion between metal layer 80 and ILD layer 46 and thus be considered a glue layer in MLI feature 40. Materials suitable for forming ESL 56 are selected such that an etch selectivity exists between it and metal layer 80 to ensure that an etching process through metal layer 80 stops at ESL 56 without causing damages to the underlaying ILD layer(s). In some embodiments, ESL 56 may include titanium nitride (TiN), tungsten nitride (WN), and/or tantalum nitride (TaN). In some embodiments, ESL 56 has a thickness of about 10 Å to about 30 Å, such as about 20 Å.

Still referring to FIGS. 1A and 3A, method 100 at operation 104 patterns metal layer 80 to form metal lines (or conductive lines) 80A, 80B, 80C, 80D, and 80E that extend vertically through ESL 56 and are separated from each other by dielectric features 82. In the present embodiments, metal lines 80A-80E, along with dielectric features 82, are together referred to as zeroth (i.e., the bottommost) metallization layer M0 of the MLI. In some embodiments, method 100 first deposits a capping layer (not shown) over metal layer 80 and a hard mask (HM) over the capping layer to accommodate the subsequent patterning process. The capping layer may include any suitable material that exhibits etching selectivity with respect to metal layer 80. The capping layer may include a metal-doped carbide, such as tungsten carbide (WC). In some embodiments, a thickness of the capping layer defines a distance D1 of dielectric features 82 that protrudes from a top surface of metal layer 80, thereby providing self-alignment capability as well as protection against potential over-etching during the subsequent etching processes. In other words, a height of dielectric features 82 is greater than a thickness of metal layer 80 by distance D1. In some embodiments, the capping layer has a thickness of about 50 Å to about 120 Å.

The HM may be a single-layer structure or, alternatively, a tri-layer structure that includes a bottom layer, a middle layer, and a top layer, each with different or, at least independent, composition. For example, the bottom layer may include TEOS, a nitrogen-free anti-reflective coating (NFAARC) film, oxygen-doped silicon carbide (ODC), silicon carbon nitride (SiCN), or plasma-enhanced oxide (PEOx); the middle layer may include a silicon-rich polymer material (e.g., $SiC_xH_yO_z$), titanium nitride (TiN), or tungsten-doped carbide (WDC); and the top layer may include TEOS or silicon oxide. The capping layer and the various layers of the HM may be formed by any suitable method, such as CVD, ALD, PVD, other suitable methods, or combinations thereof.

Subsequently, method 100 patterns the HM and the capping layer in a series of lithography and etching processes, and thereafter etches metal layer 80 using the patterned HM and the capping layer as an etch mask. The HM may be patterned by using any suitable process, such as a photolithography process, which includes forming a photoresist layer (not shown) over the HM, exposing the photoresist layer to a radiation source, baking the exposed photoresist layer, and developing the photoresist layer to form a patterned photoresist layer. After patterning the HM, the patterned photoresist layer is removed by a suitable method, such as plasma ashing or resist stripping. The patterned HM may then be used as an etch mask to pattern the capping layer, thereby transferring the pattern of multiple openings to the capping layer. The HM and the capping layer may each be etched by a suitable method including a dry etching process, a wet etching process, or a combination thereof.

Thereafter, still referring to FIG. 3A, method 100 etches metal layer 80 using the patterned HM and capping layer as the etch mask. Etching metal layer 80 may include applying a dry etching process, a wet etching process, or a combination thereof. In some examples, a dry etching process may be applied to etch metal layer 80 using an etchant that includes a chlorine-containing gas (e.g., $Cl_2$, $CHCl_3$, $CCl_4$), a fluorine-containing gas (e.g., $CF_4$, $SF_6$, $CH_2F_2$, $CHF_3$, $C_4F_8$, $C_2F_6$), a boron-containing gas (e.g., $BF_3$, $BCl_3$, $BBr_3$), argon, other suitable gases, or combinations thereof. The resulting metal layer 80 includes multiple metal lines 80A-80E separated by trenches.

Subsequently, a dielectric capping layer 81 is deposited over the patterned metal layer 80, thereby conformally lining the trenches between the metal lines 80A-80E. Dielectric capping layer 81 is configured to block diffusion of metal atoms from the metal lines 80A-80E into the dielectric layer to be deposited in the trenches. Dielectric capping layer 81 may include a metal nitride and/or a metal oxide, such as titanium nitride (TiN), tantalum nitride (TaN), aluminum oxide ($Al_2O_3$), other suitable materials, or combinations thereof, and may be deposited by any suitable method, such as CVD, ALD, other methods, or combinations thereof. The trenches are then filled with a dielectric layer that may include silicon oxide (SiO and/or $SiO_2$), silicon oxynitride (SiON), silicon nitride (SiN), TEOS, un-doped silicate glass, or doped silicon oxide such as BPSG, FSG, PSG, BSG, a low-k dielectric material, other suitable materials, or combinations thereof. The dielectric layer may be formed by CVD, FCVD, spin-on coating, other suitable methods, or combinations thereof and subsequently planarized using a CMP process, for example, to form dielectric features 82 between metal lines 80A-80E. The CMP process may remove portions of dielectric capping layer 81 from a top surface of metal layer 80, while portions of the dielectric capping layer 81 remain along sidewalls and a bottom surface of dielectric features 82. In some embodiments, dielectric features 82 include the same composition as that of ILD layers 42-46.

Subsequently, method 100 selectively removes capping layer with respect to the dielectric layer and metal layer 80, resulting in dielectric features 82 to protrude from a top surface of metal layer 80 (i.e., metal lines 80A-80E) by the distance D1 as defined previously. In the present embodiments, adjacent dielectric features 82 are separated by a pre-determined distance that corresponds to a width of each metal line 80A-80E, e.g., a width of metal line 80B may be defined as 51 and a width of metal line 80D may be defined as S2.

Figure 3B:
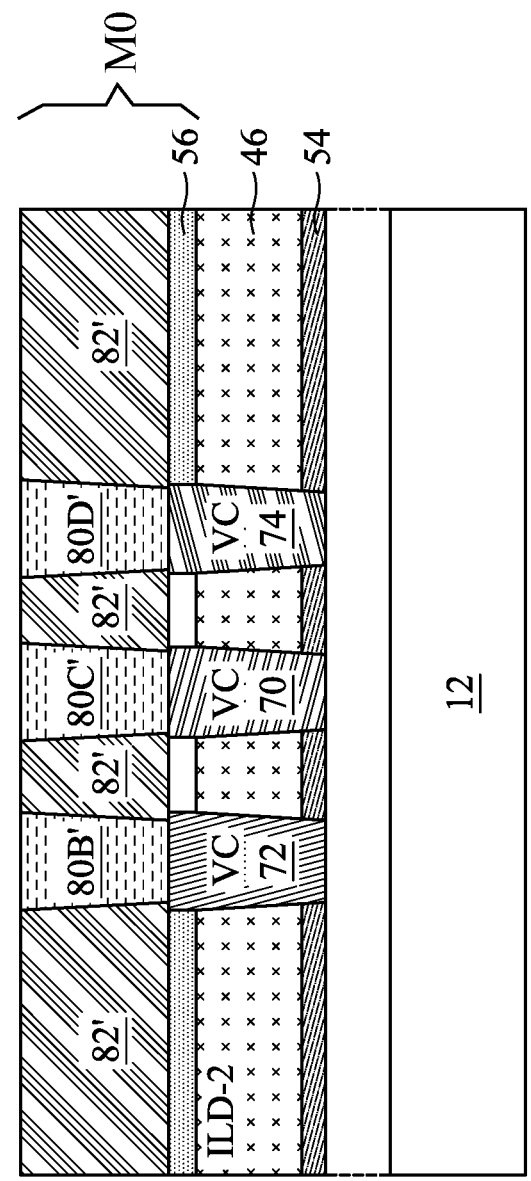

In some embodiments, referring to FIG. 3B, metal lines 80B', 80C', and 80D' are formed in a dielectric feature (or an ILD layer) 82' in a configuration alternative to that depicted in FIG. 3A. For example, forming metal lines 80B'-80D' may include first forming dielectric feature 82' over ESL 56, forming trench-like openings in dielectric feature 82' to expose VCs 70-74, depositing a metal layer over the patterned dielectric feature 82' to fill the trench-like openings, and performing a CMP process to form metal lines 80B'-80D' in the trench-like openings to contact VCs 70-74, respectively. In contrast, the embodiment depicted in FIG. 3A is formed by patterning a metal layer (e.g., metal layer 80) to form openings therein and subsequently filling the openings to form dielectric features (e.g., dielectric features 82), thereby separating the metal layer into multiple metal lines (e.g., metal lines 80A-80E). In some embodiments, top surfaces of dielectric feature 82' and those of metal lines 80B'-80D' are substantially coplanar, i.e., dielectric feature 82 does not protrude from metal lines 80B'-80D'. For purposes of simplicity, subsequent operations of method 100 are discussed using the embodiment depicted in FIG. 3A as an example, though the embodiment depicted in FIG. 3B provides an equally applicable configuration of zeroth metallization layer M0.

Figure 4:
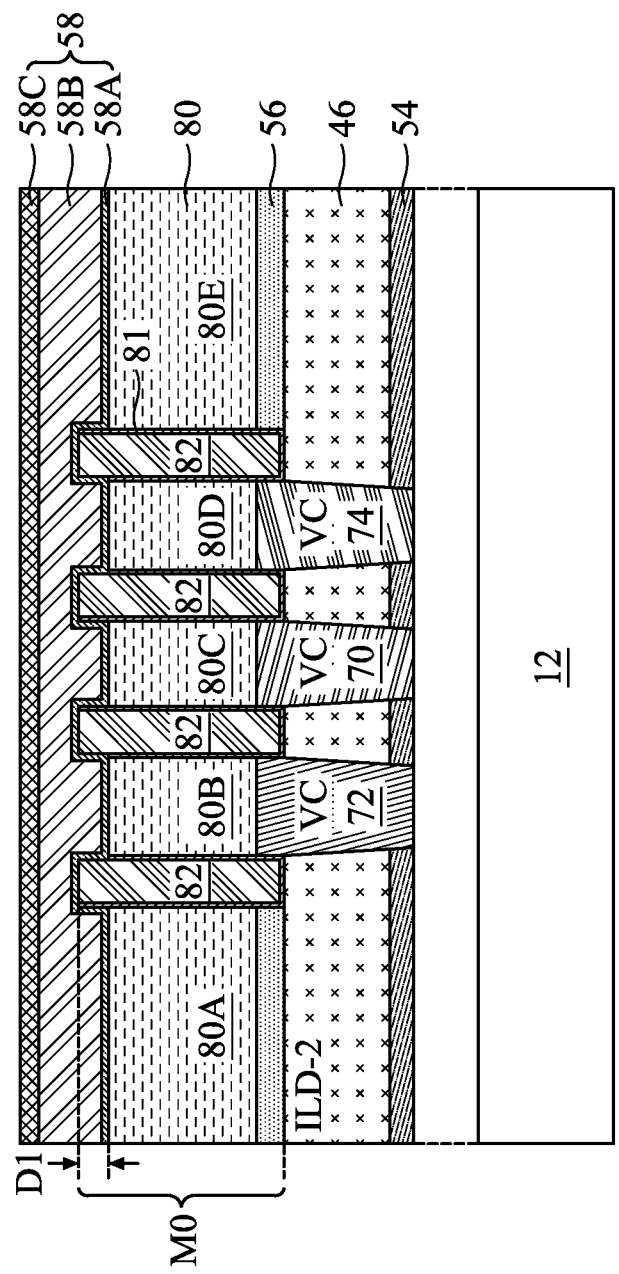

Still referring to FIGS. 1A and 4, method 100 at operation 106 deposits an ESL stack 58 over zeroth metallization layer M0. In the present embodiments, ESL stack 58 includes multiple ESLs, such as ESL 58A over metal layer 80, ESL 58B over ESL 58A, and ESL 58C over ESL 58B. As such, ESL stack 58 may be considered a sandwiched ESL stack. Notably, for embodiments consistent with that depicted in FIG. 3A, ESL 58A traverses (i.e., is formed conformally over) the protruded portions of dielectric features 82, such that ESL 58A has an uneven topography compared to ESLs 58B and 58C deposited thereover. In the present embodiments, ESL stack 58 is configured to provide etching selectivity with respect to components of the underlying zeroth metallization layer M0, i.e., metal layer 80 and dielectric features 82, thereby protecting zeroth metallization layer M0 from being inadvertently damaged by subsequent etching processes.

Each layer of ESL stack 58 may include one or more suitable dielectric material, such as a nitrogen-containing material (e.g., aluminum nitride (AlN), SiN, etc.), an aluminum-containing material (e.g., AlN, aluminum oxide ($Al_2O_3$), etc.), a carbon-containing material (e.g., silicon carbide (SiC), nitrogen-doped carbide (NDC), ODC, hydrogen-and-nitrogen-doped carbide (HNDC), etc.), a high-k dielectric material, other dielectric materials, or combinations thereof. For purposes of enhancing etching selectivity and controlling dimension of the etched features, in some embodiments, any two adjacent ESLs of ESL stack 58 are configured with different compositions, i.e., ESLs 58A and 58B include different dielectric material(s) and ESLs 58B and 58C include different dielectric material(s). In some embodiments, ESLs 58A and 58C have the same or substantially the same compositions. In some embodiments, ESLs 58A and/or 58C include a dielectric material having a higher dielectric constant than a dielectric material included in ESL 58B. In some embodiments, ESL 58B is configured to absorb any excess moisture (e.g., released during a wet etching process), which may damage the low-k dielectric material included in dielectric features 82. In some examples, ESL 58A may include AN, $Al_2O_3$, SiN, or combinations thereof, ESL 58B may include a carbide material, and ESL 58C may include AN, $Al_2O_3$, SiN, or combinations thereof. Of course, compositions of each layer in ESL stack 58 are not limited to examples provided herein, so long as they are suitable for protecting zeroth metallization layer M0 during the subsequent etching processes.

Each layer of ESL stack 58 may be deposited by any suitable method, including CVD, ALD, PVD, other methods, or combinations thereof. In some examples, a thickness of ESL 58A may be about 10 Å to about 50 Å, a thickness of ESL 58B may be about 10 Å to about 200 Å, and a thickness of ESL 58C may be about 10 Å to about 110 Å. Of course, these numeric ranges are mere examples and are not limiting for the present disclosure. In some embodiments, thicknesses of ESLs 58A-58C are configured to improve etching selectivity and/or resolution of features subsequently formed in and/or through ESL stack 58. In some examples, the thickness of ESL 58A may be less than that of ESL 58C, which may be less than that of ESL 58B.

Figure 5:
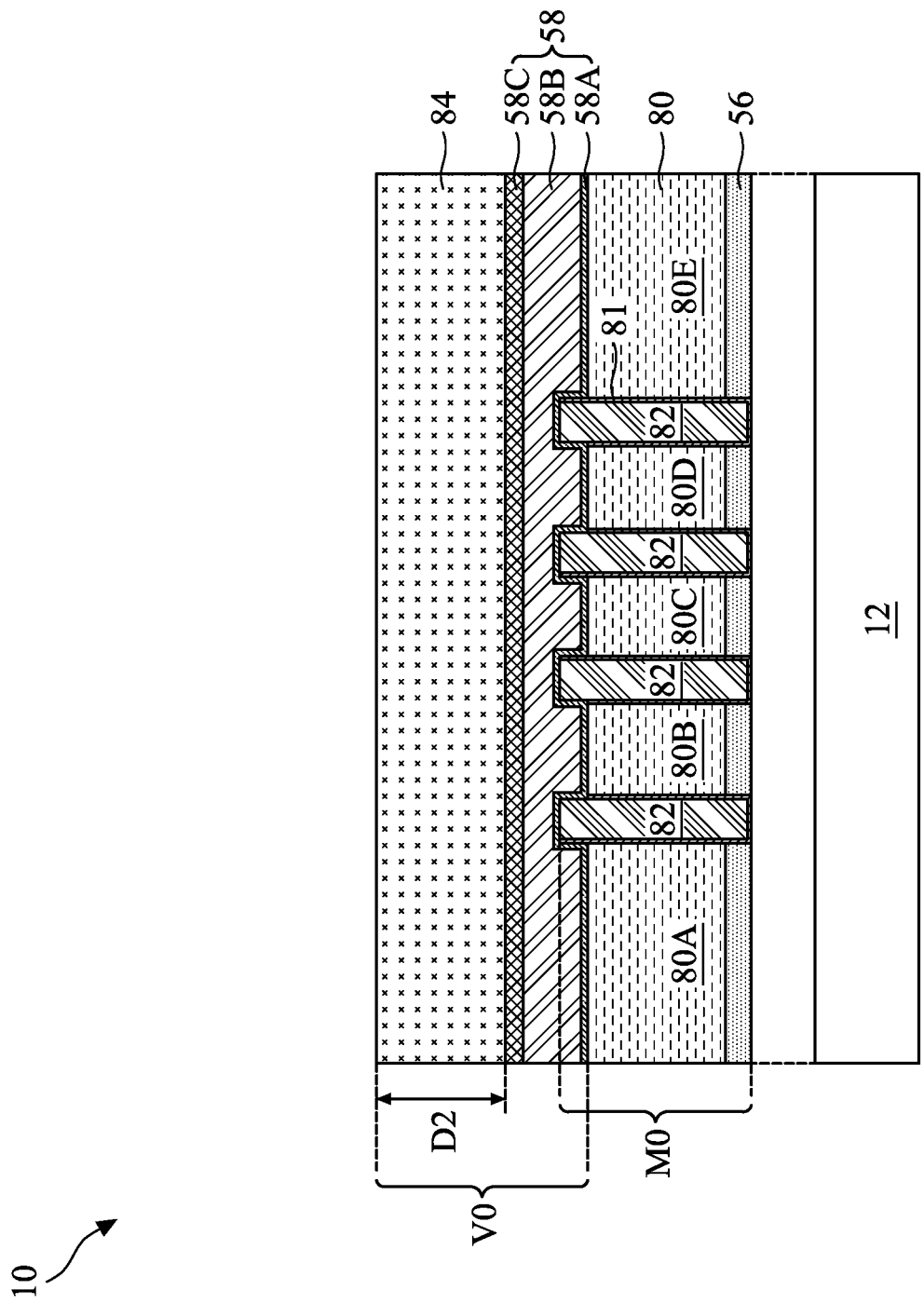

Now referring to FIGS. 1A and 5, method 100 at operation 108 forms an ILD layer 84 over ESL stack 58. In the present embodiments, ILD layer 84 includes a dielectric material such as, for example, silicon oxide, a low-k dielectric material, TEOS, un-doped silicate glass, or doped silicon oxide such as BPSG, FSG, PSG, BSG, other suitable dielectric materials, or combinations thereof. In the depicted embodiment, ILD layer 84 includes a low-k dielectric material. In some embodiments, ILD layer 84 has a composition substantially similar to or the same as that of ILD layer 42-46. ILD layer 84 may be formed by any suitable method, such as CVD, FCVD, spin-on coating, other methods, or combinations thereof, to a thickness D2 of about 230 Å to about 400 Å. Of course, thickness D2 is not limited to such numeric values in the present embodiments and may be adjusted based on desired dimensions of the subsequently-formed via contacts in ILD layer 84. As will be discussed in detail below, ILD layer 84 provides passivation for a zeroth via contact V0 that is electrically coupled to metal lines 80A-80E through ESL stack 58.

Figure 6:
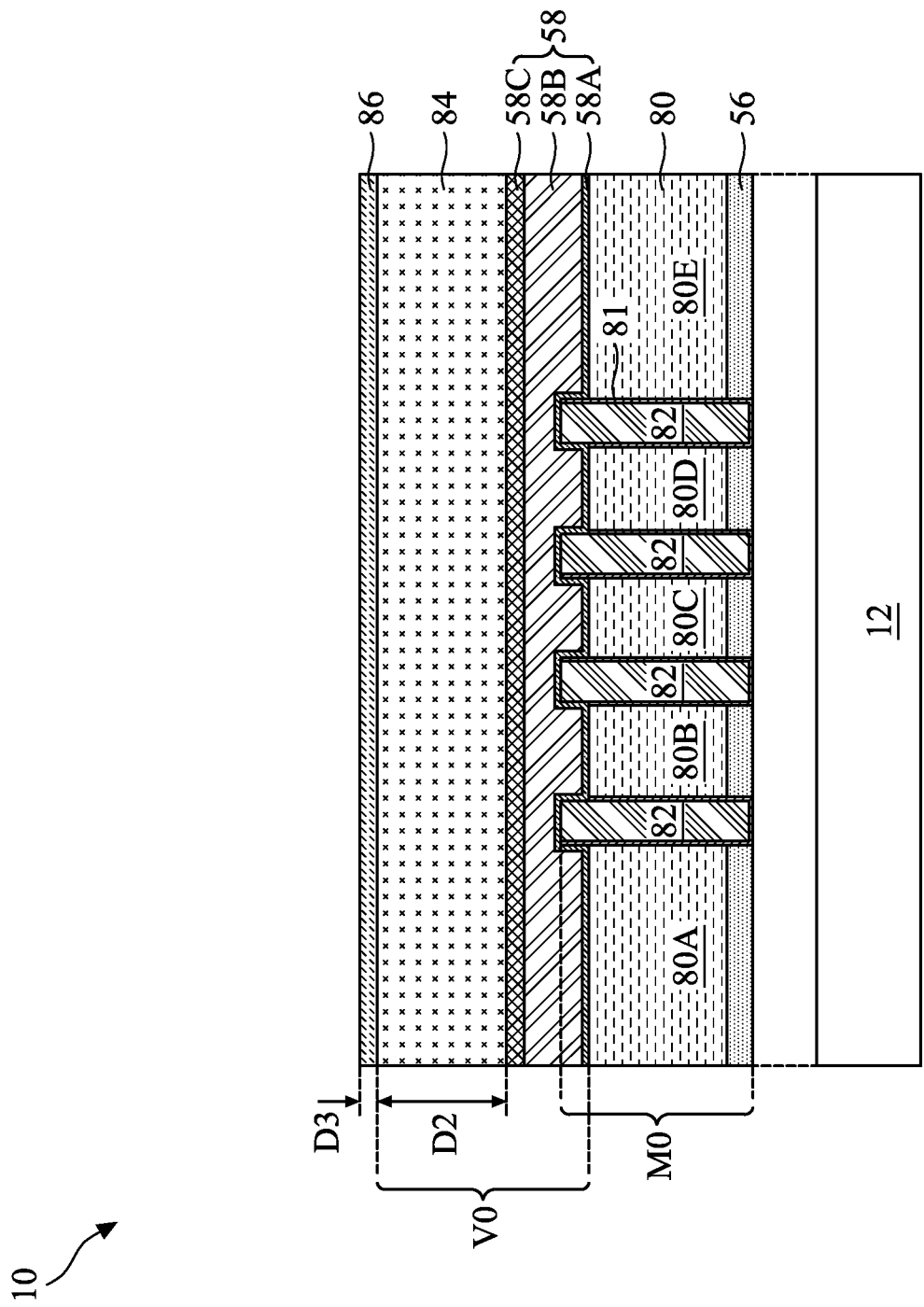

Referring to FIGS. 1A and 6, method 100 at operation 110 forms and patterns an ESL 86 over ILD layer 84, such that the patterned ESL 86 includes one or more openings, e.g., openings 86A and 86B, configured to expose portions of ILD layer 84. In the present embodiments, ESL 86 includes a suitable dielectric material different from the composition of ILD layer 84, so as to prevent or minimize etching of ILD layer 84 during the subsequent patterning process. In some embodiments, ESL 86 includes a nitrogen-containing material (e.g., aluminum nitride (AlN), SiN, etc.), an aluminum-containing material (e.g., AN, aluminum oxide ($Al_2O_3$), etc.), a high-k dielectric material, other suitable dielectric materials, or combinations thereof. In some embodiments, ESL 86, ESL 58A, and ESL 58C have the same composition. ESL 86 may be formed by any suitable method, such as CVD, ALD, PVD, other methods, or combinations thereof. In the present embodiments, a thickness D3 of ESL 86 is less than thickness D2 of ILD layer 84. In this regard, a ratio of thickness D3 to thickness D2 may be about 0.09 to about 0.2; of course, other suitable ratios may also be applicable in the present embodiments. In some embodiments, thickness D3 is selected based on the composition of ESL 86 with respect to the composition of ILD layer 84, such that etching selectivity between these components may be enhanced to facilitate subsequent operations. In some examples, thickness D3 may be about 10 Å to about 50 Å.

Figure 7:
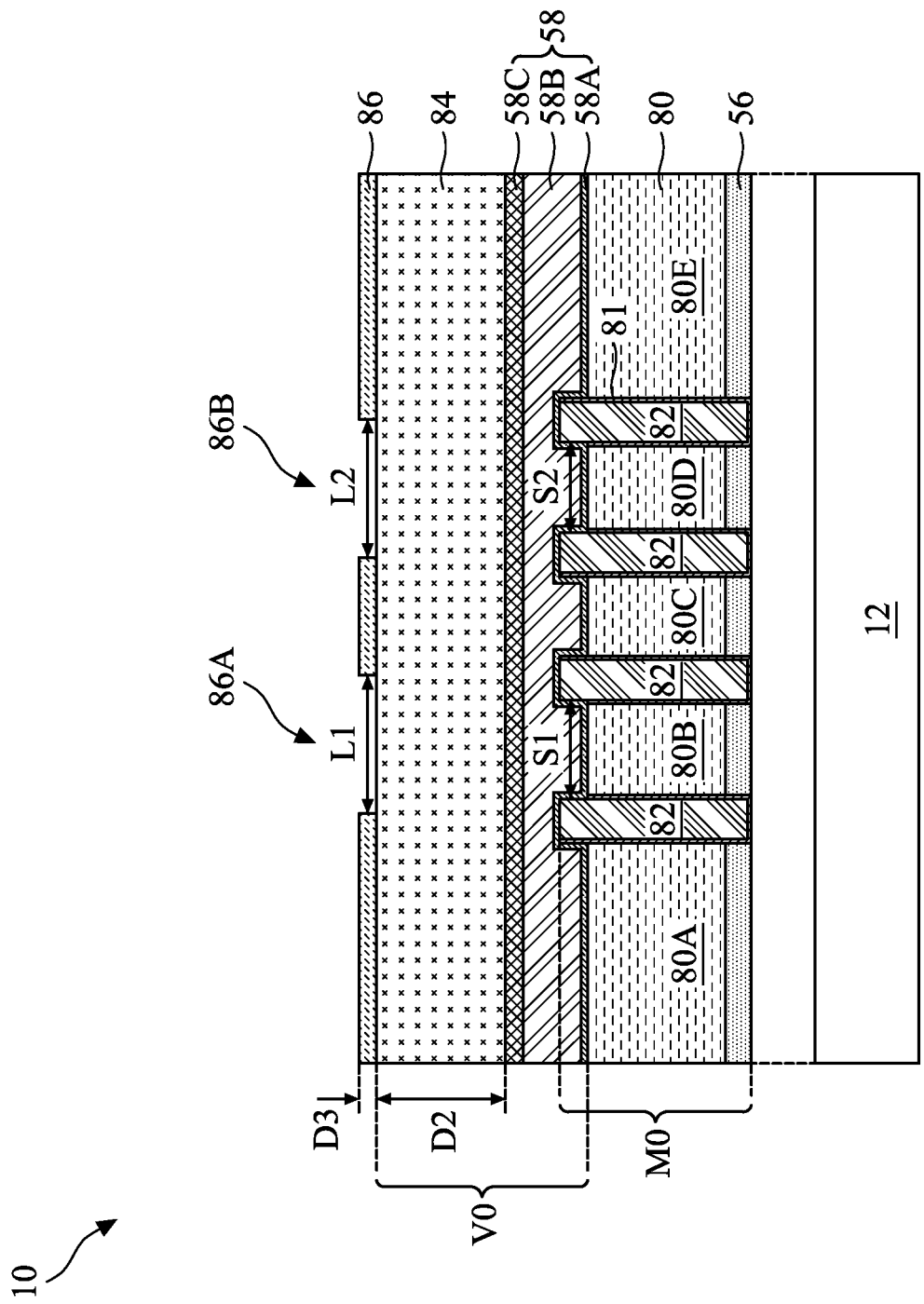

Subsequently, still referring to FIG. 7, method 100 at operation 110 patterns ESL 86 to form at least one opening, such as openings 86A and 86B defined by a width L1 and a width L2, respectively. In the present embodiments, widths L1 and L2 each define a top dimension of the via contacts to formed in ILD layer 84, while widths S1 and S2 each define a bottom dimension of the same via contacts. In other words, the patterned ESL 86 serves as an etch mask for patterning ILD layer 84 (and ESL stack 58) to form trenches (e.g., trenches 94A and 94B as depicted in FIGS. 11 to 15) in which one or more via contact are subsequently formed. In some embodiments, openings 86A and 86B are generally aligned with metal lines 80B and 80D, respectively, such that the subsequently formed trenches in ILD layer 84 exposes metal lines 80B and 80D. In the present embodiments, dielectric features 82 are configured to assist in a self-alignment process as well as protect against potential over-etching due to patterning alignment.

In some embodiments, patterning ESL 86 includes performing a series of lithography patterning and etching processes similar to those discussed in detail above with respect to forming gate structures 20A-20C. For example, a patterned masking element including one or more openings may be formed over ESL 86 and used as an etch mask to transfer the openings to ESL 86 via one or more etching processes. After transferring the pattern to ESL 86, the patterned masking element is removed by any suitable method, such as plasma ashing and/or resist stripping. It is understood that the patterned ESL 86 may include any suitable number of openings, such as one, or three, or five, depending upon a desired number of via contacts to be formed in zeroth via contact V0.

Figure 8:
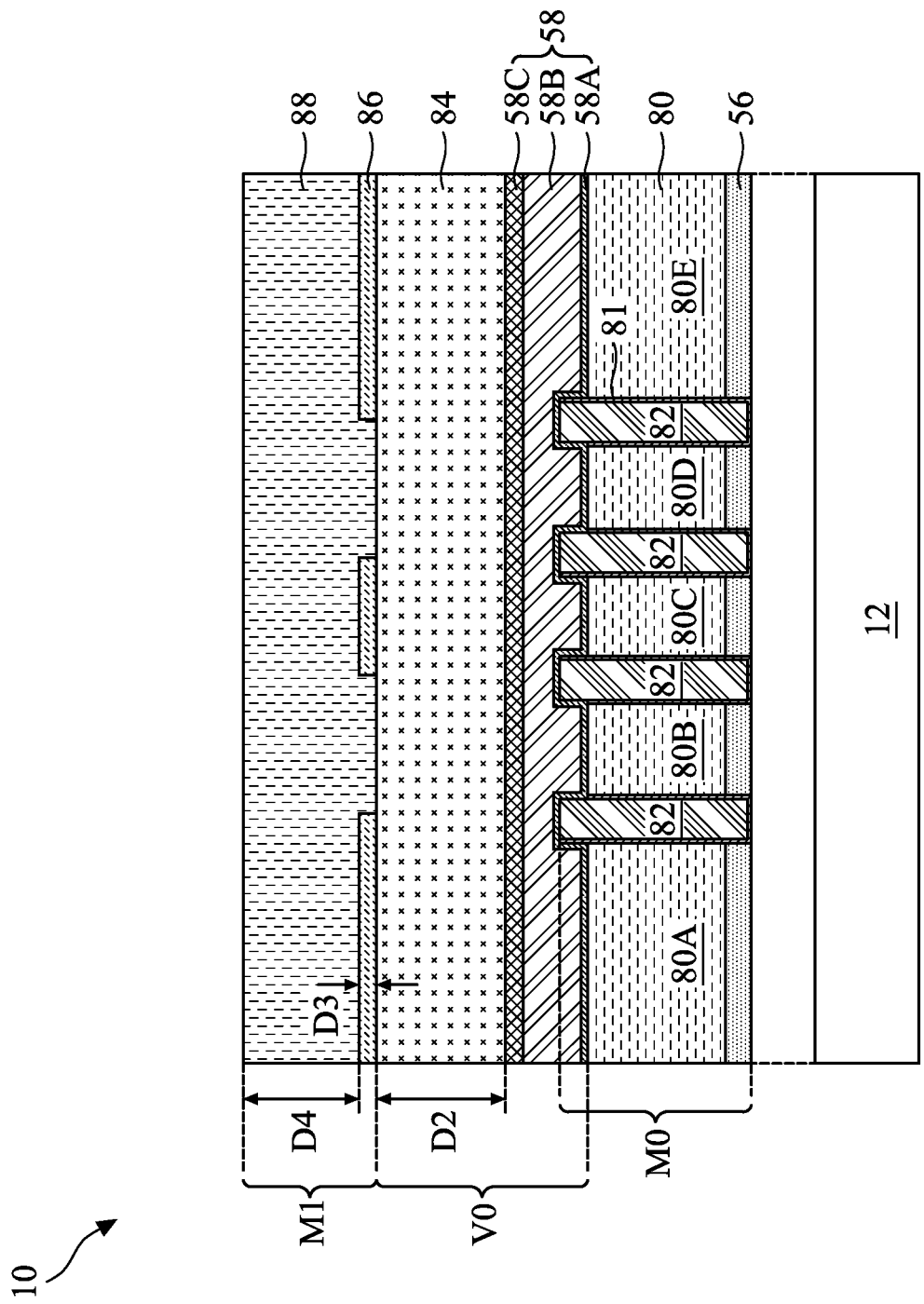

Now referring to FIGS. 1A and 8, method 100 at operation 112 forms an ILD layer 88 over the patterned ESL 86, thereby filling openings 86A and 86B. In other words, ILD layer 88 extends through openings 86A and 86B to contact ILD layer 84. As will be discussed in detail below, ILD layer 88 constitutes a dielectric component of a first metallization layer M1, which includes one or more metal lines (or conductive lines) electrically connected to zeroth metallization layer M0 by zeroth via contact V0.

In the present embodiments, ILD layer 88 includes a dielectric material such as, for example, silicon oxide, a low-k dielectric material, TEOS, un-doped silicate glass, or doped silicon oxide such as BPSG, FSG, PSG, BSG, other suitable dielectric materials, or combinations thereof. In the depicted embodiment, ILD layer 88 includes a low-k dielectric material. In the present embodiments, the composition of ILD layer 88 is selected such that its etching selectivity with respect to ESL 86 is significantly greater than its etching selectivity with respect to ILD layer 84, such that the subsequent removal of the portions of ILD layer 88 formed in openings 86A and 86B does not remove, or substantially remove, the patterned ESL 86. In some embodiments, ILD layer 84 has a composition substantially similar to or the same as that of ILD layer 84, such that etching selectivity between ILD layers 84 and 88 is minimized. Of course, the present embodiments do not limit the composition of ILD layers 84 and 88, so long as their compositions allow them to be etched, or substantially etched, in a single etching process (e.g., by a common etchant) without etching, or substantially etching, the patterned ESL 86. As such, in some embodiments, ILD layers 88 and 84 have different compositions. ILD layer 88 may be formed by any suitable method, such as CVD, FCVD, spin-on coating, other methods, or combinations thereof. In the present embodiments, thickness D3 of ESL 86 is less than a thickness D4 of ILD layer 88. In this regard, a ratio of thickness D3 to thickness D4 may be about 0.1 to about 0.3; of course, other suitable ratios may also be applicable in the present embodiments. Similar to the discussion above, in some embodiments, thickness D3 is selected based on the composition of ESL 86 with respect to the composition of ILD layer 88, such that etching selectivity between these components may be enhanced to facilitate subsequent operations. In some examples, thickness D4 may be about 70 Å to about 300 Å.

Figure 9:
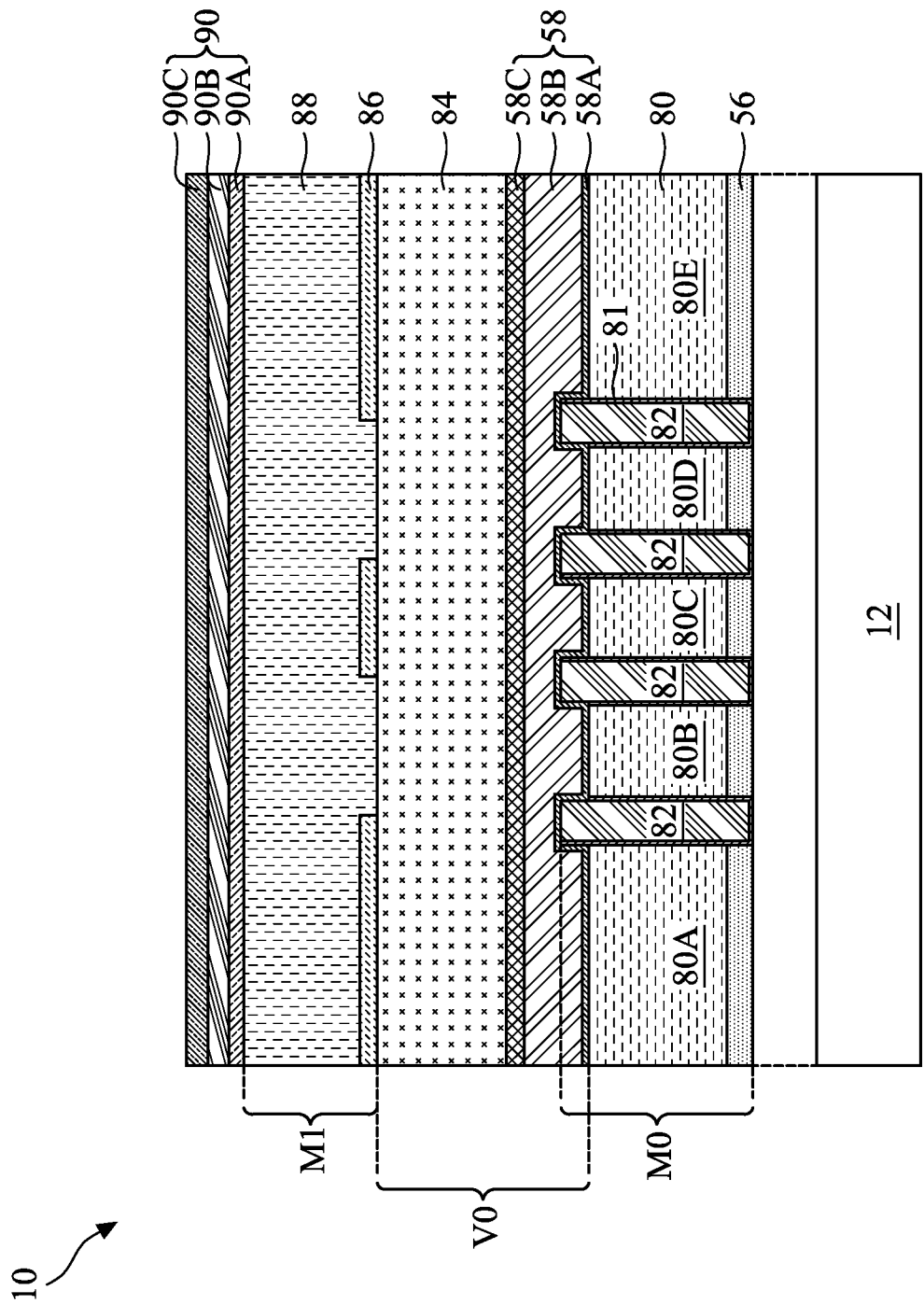

Referring to FIGS. 1A and 9, method 100 at operation 114 forms an HM 90 over ILD layer 88. HM 90 may be a single-layer structure or, as depicted herein, a tri-layer structure that includes a bottom layer 90A disposed over ILD layer 88, a middle layer 90B disposed over bottom layer 90A, and a top layer 90C disposed over middle layer 90B, each with different or, at least independent, composition. In some embodiments, HM 90 has substantially the same composition as the HM formed over metal layer 80 as discussed in detail above. For example, bottom layer 90A may include TEOS, an NFAARC film, ODC, SiCN, or PEOx; middle layer 90B may include a silicon rich polymer material (e.g., $SiC_xH_yO_z$), TiN, or WDC; and top layer 90C may include TEOS or silicon oxide. In some embodiments, various layers of HM 90 are free, or substantially free, of any metal. For purposes of enhancing etching selectivity and controlling dimension of the etched features, in some embodiments, any two adjacent layers of HM 90 are configured with different compositions, i.e., bottom layer 90A and middle layer 90B include different dielectric material(s) and middle layer 90B and top layer 90C include different dielectric material(s). In some embodiments, bottom layer 90A and top layer 90C have substantially the same composition, which is different from that of middle layer 90B. In some embodiments, bottom layer 90A functions as a capping layer for protecting ILD layer 88 from bending during the subsequent etching processes.

The various layers of HM 90 may be formed by any suitable method, such as CVD, ALD, PVD, other suitable methods, or combinations thereof. In some examples, bottom layer 90A may be formed to a thickness of about 70 Å to about 250 Å, and middle layer 90B and top layer may each be formed to a thickness of about 200 Å to about 300 Å. Of course, the present embodiments are not limited by these numeric ranges. In some embodiments, compositions and thicknesses of various layers of HM 90 are selected to enhance the overall etching selectivity between HM 90 and the underlying ILD layer 88, as well as to reduce roughness along edges of openings to be formed during the patterning of HM 90.

Figure 10:
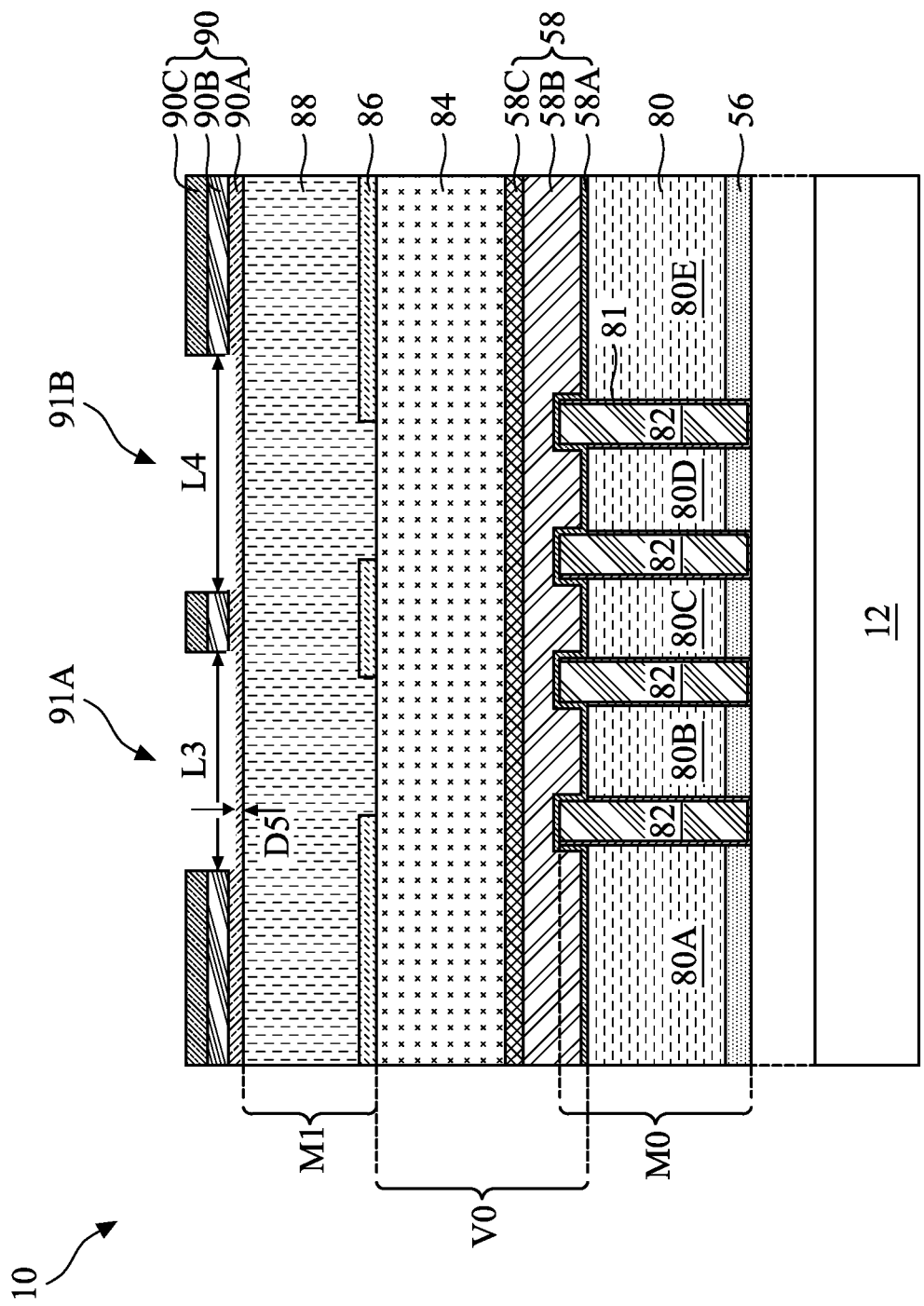

Now referring to FIG. 10, method 100 at operation 114 patterns HM 90 to form at least one opening, such as openings 91A and 91B defined by a width L3 and a width L4, respectively. In the present embodiments, width L3 and width L4 each define a top dimension of a metal line formed in ILD layer 88. In other words, patterned HM 90 serves as an etching mask for patterning ILD layer 88 to form opening(s) in which one or more metal lines may be subsequently formed. In the present embodiments, widths L3 and L4 are each greater than widths L1 and L2. In some embodiments, patterning HM 90 includes performing a series of lithography patterning and etching processes similar to those discussed in detail above with respect to forming gate structures 20A-20C. For example, a patterned masking element including one or more openings may be formed over HM 90 and used as an etch mask to transfer the openings to HM 90 via one or more etching processes. In some embodiments, as depicted herein, transferring the openings to HM 90 includes performing more than one etching process, e.g., bottom layer 90A, middle layer 90B, and top layer 90C may be etched by separate and independent etching processes. In one example depicted in FIG. 10, etching through top layer 90C and middle layer 90B may leave behind at least a portion of bottom layer 90A, which may then be removed by a subsequent etching process. In some examples, the remaining portion of bottom layer 90A in openings 91A and 91B may have a thickness D5 less than the thickness of bottom layer 90A as discussed above. In some examples, thickness D5 may be about 150 Å to about 250 Å. After transferring the pattern to HM 90, the patterned masking element is removed by any suitable method, such as plasma ashing and/or resist stripping. Subsequently, the patterned middle layer 90B and top layer 90C (as well as the portions of bottom layer 90A defined by thickness D5) are removed by a suitable wet etching process, leaving behind the patterned bottom layer 90A (see FIG. 11) over the underlying ILD layer 88. It is understood that patterned HM 90 may include any suitable number of openings, such as one, or three, or five, depending upon a desired number of metal lines to be formed in first metallization layer M1.

Figure 11:
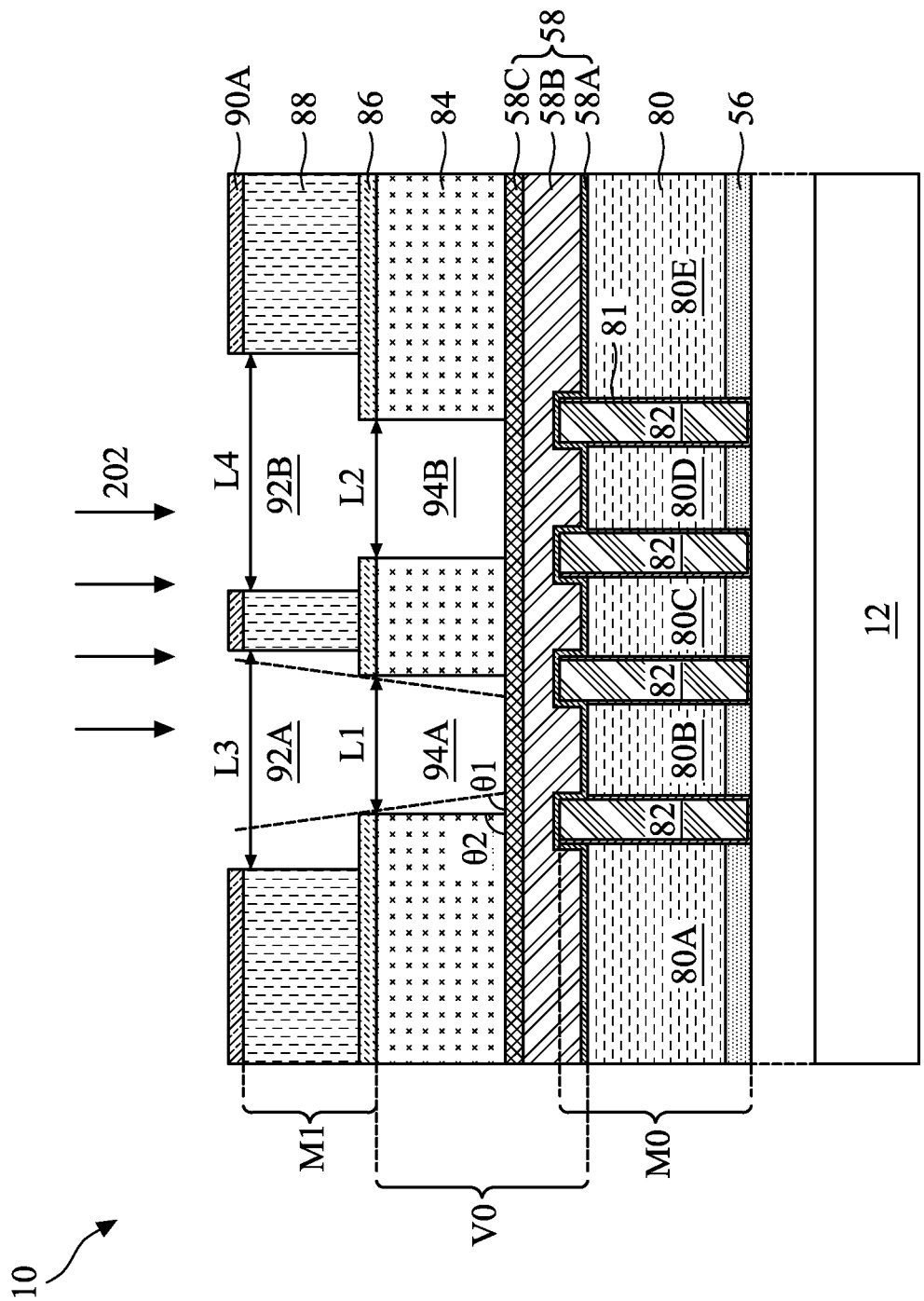
Figure 12:
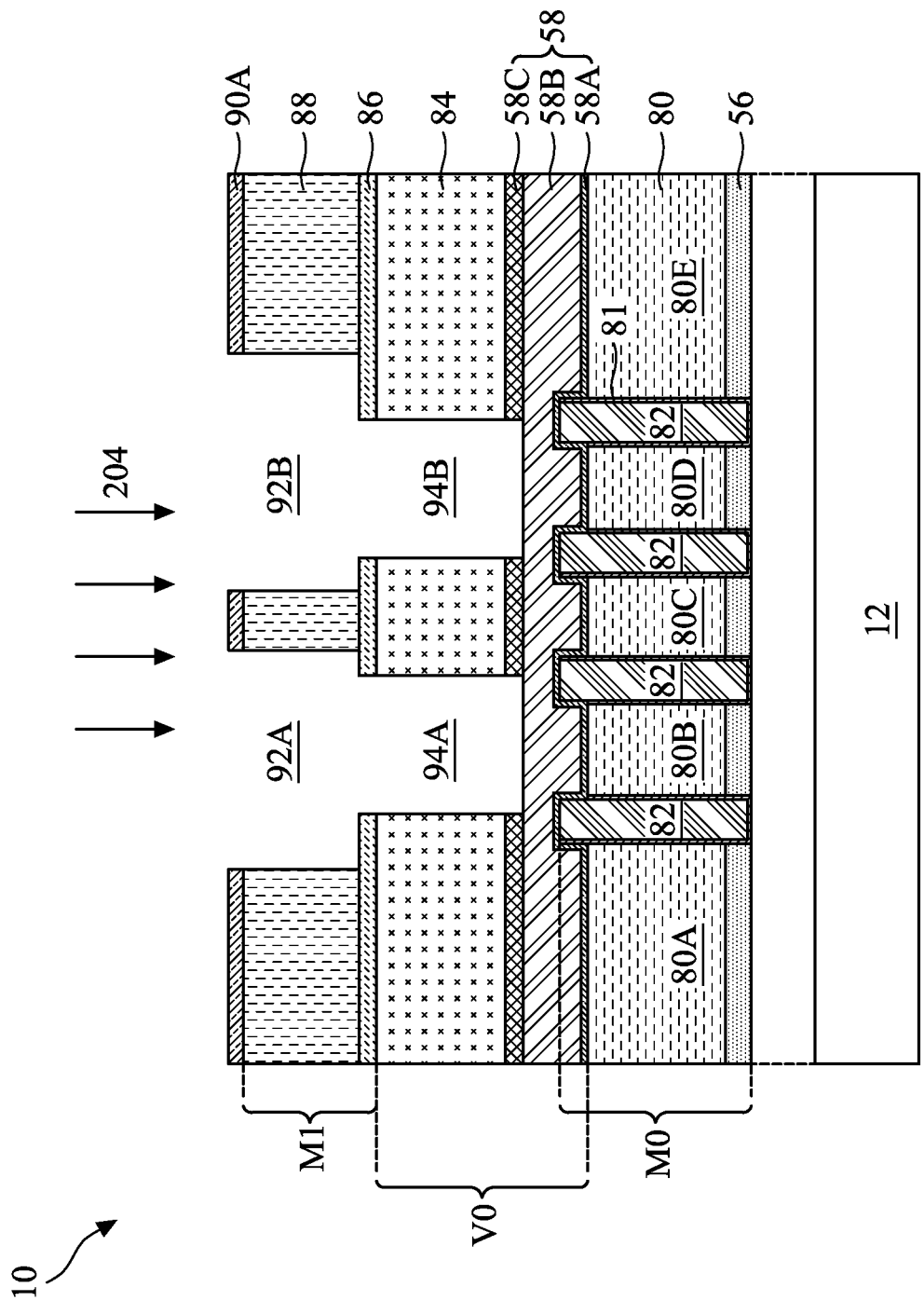

Now referring to FIGS. 1B and 11, method 100 at operation 116 performs an etching process 202 to form a trench 92A and a trench 92B in ILD layer 88 as well as a trench 94A and a trench 94B in ILD layer 84 (and ESL 86). In other words, etching process 202 is configured to remove portions of ILD layer 88 using the patterned bottom layer 90A as an etch mask and remove portions of ILD layer 84 using the patterned ESL 86 as an etch mask, such that a width of the top opening of trenches 92A, 92B, 94A, and 94B are defined by widths L3, L4, L1, and L2, respectively. Because the patterned ESL 86 is sandwiched between ILD layers 84 and 88, whose compositions are configured to minimize the etching selectivity therebetween, etching process 202 is able to remove portions of ILD layers 84 and 88 exposed by openings 91A, 91B, 86A, and 86B. In the present embodiments, trenches 92A and 92B are configured to provide metal lines of first metallization layer M1 and trenches 94A and 94B are configured to provide via contacts of zeroth via contact V0. As such, embodiments of the present disclosure allow metal lines and via contacts of adjacent layers in an interconnect structure to be patterned in a single etching step. In the present embodiments, an aspect ratio of each of trenches 94A and 94B is greater than that of trenches 92A and 92B.

In the present embodiments, etching process 202 is a dry etching process (e.g., an RIE process) that implements a suitable etchant for selectively removing exposed portions of ILD layer 84 and 88 without removing, or substantially removing, portions of ESL stack 58 (e.g., ESL 58C). In some embodiments, etching process 202 implements a fluorine-containing gas (e.g., $CF_4$, $SF_6$, $CH_2F_2$, $CHF_3$, $C_4F_8$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an oxygen-containing gas (e.g., $O_2$), other suitable gases, or combinations thereof, to directionally (i.e., anisotropically) remove portions of ILD layer 84 and 88, resulting in sidewalls of trenches 92A, 92B, 94A, and 94B to be substantially perpendicular to bottom surfaces of the trenches.

A common process for forming metal lines or via contacts is known as a "damascene" process. Generally, a damascene process involves forming trench-like openings in an ILD layer. A trench-like opening is typically formed using conventional lithographic and etching techniques. After the trench-like opening is formed, a diffusion barrier layer and an adhesion layer are deposited within the trench-like opening. A deposition process (e.g., CVD, PVD, electro-chemical plating) is then used to fill the trench-like opening with metal or metal alloys to form a metal line and/or a via contact underneath the metal line. Excess metal material on the surface of the ILD layer is then removed by a CMP process.

When the metal line and the via contact are formed together, the process is referred to as a dual damascene process. The dual damascene process may pattern the metal line first and then the via contact in a "trench-first" approach or, alternatively, pattern the via contact first and then the metal line in a "via-first" approach. Because the via contact generally has a higher aspect ratio than the metal line, patterning the via contact may result in a deep trench, which could limit the extent of etchant loading toward the bottom of the trench, resulting in slanted sidewalls as indicated by dotted lines in FIG. 11. In some instances, an angle $\theta 1$, which reflects the degree of such slant, may be about 50° to about 65°. The narrowing toward the bottom of the trench inadvertently reduces a contact area between the via contact and the underlying metal layer, leading to higher contact resistance in the interconnect structure. In an effort to correct the slanted profile, additional etching process may be applied when forming the trench for the via contact to ensure adequate opening at the bottom of the trench. However, extended application of such etching process may lead to excessive removal of the ILD layer in areas not intended to be removed, potentially damaging insulating structures (e.g., ILD layers) and negatively impacting the final dimension of the metal lines and the via contact.

Figure 17:
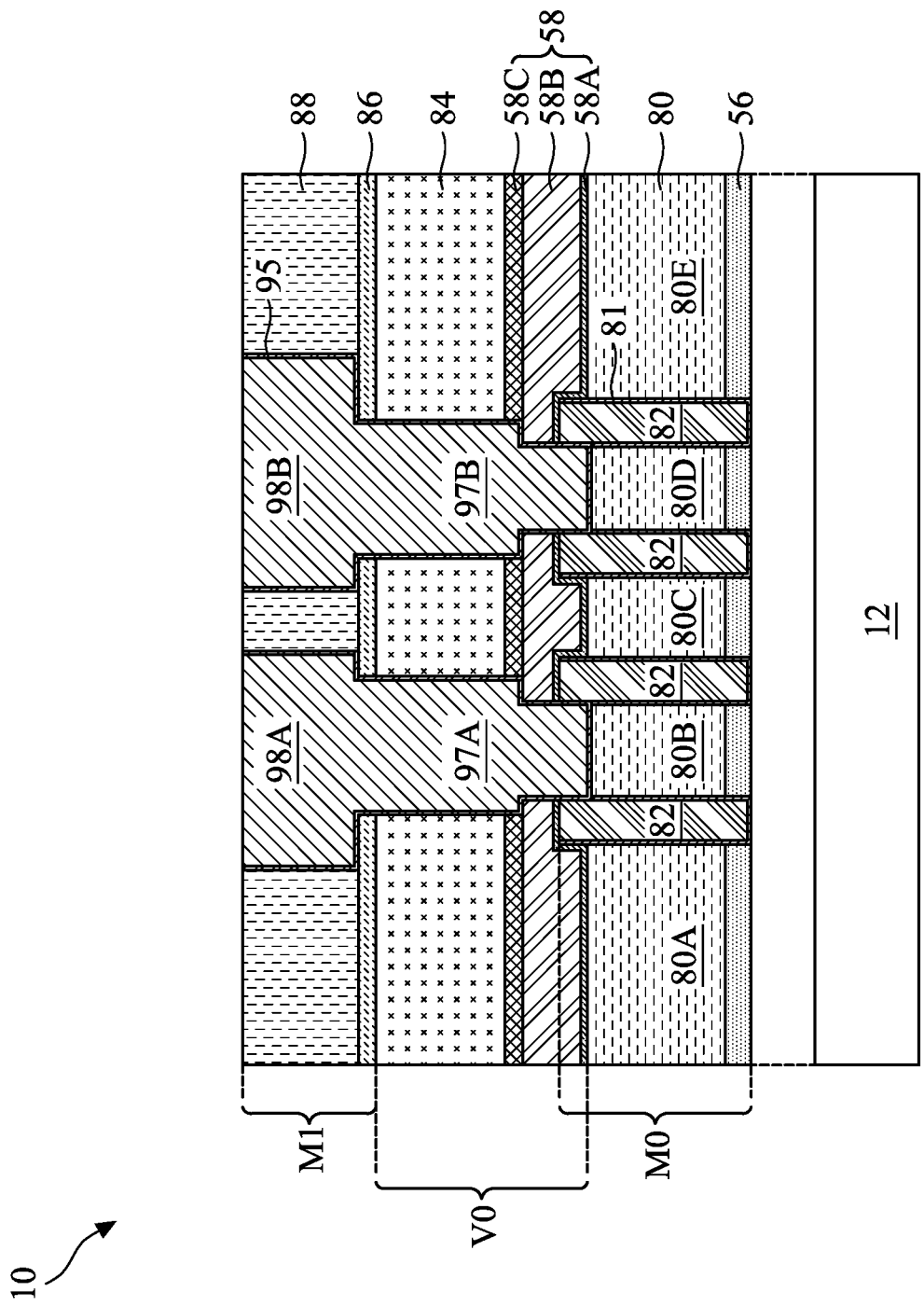

The present disclosure provides a method of forming a metal line and a via contact by first forming a patterned ESL (e.g., ESL 86) that defines the dimension of the via contact (e.g., VCs 97A and 97B as depicted in FIG. 17) to be formed in a first ILD layer before forming and patterning a second ILD layer in which the metal line is formed. In other words, the dimension of the via contact is controlled by the opening(s) defined in the patterned ESL, which is sandwiched between the two ILD layers, resulting in vertical sidewalls of the trench in the first ILD layer to be more perpendicular with the bottom surface of the trench. For example, in the present embodiments, still referring to FIG. 11, an angle $\theta 2$, which measures the slant of the sidewalls of trenches 94A and 94B, is greater than about 80°. Accordingly, no extended application of dry etching is needed to maintain desired contact area between the via contact the underlying conductive features.

In the present embodiments, due to the etching selectivity between ILD layer 84 (and ILD layer 88) and ESL 58C, etching process 202 stops on (or exposes) ESL 58C. Now referring to FIGS. 1B and 12, method 100 at operation 118 selectively removes the exposed portions of ESL 58C in an etching process 204. In the present embodiments, etching process 204 implements a wet etchant that includes, for example, hydrofluoric acid (HF), ammonium fluoride ($NH_4F$), hydrogen peroxide ($H_2O_2$), other suitable etchants, or combinations thereof. Notably, etching process 204 stops on (or exposes) ESL 58B due to the etching selectivity exhibited between ESLs 58B and 58C discussed in detail above.

Figure 13:
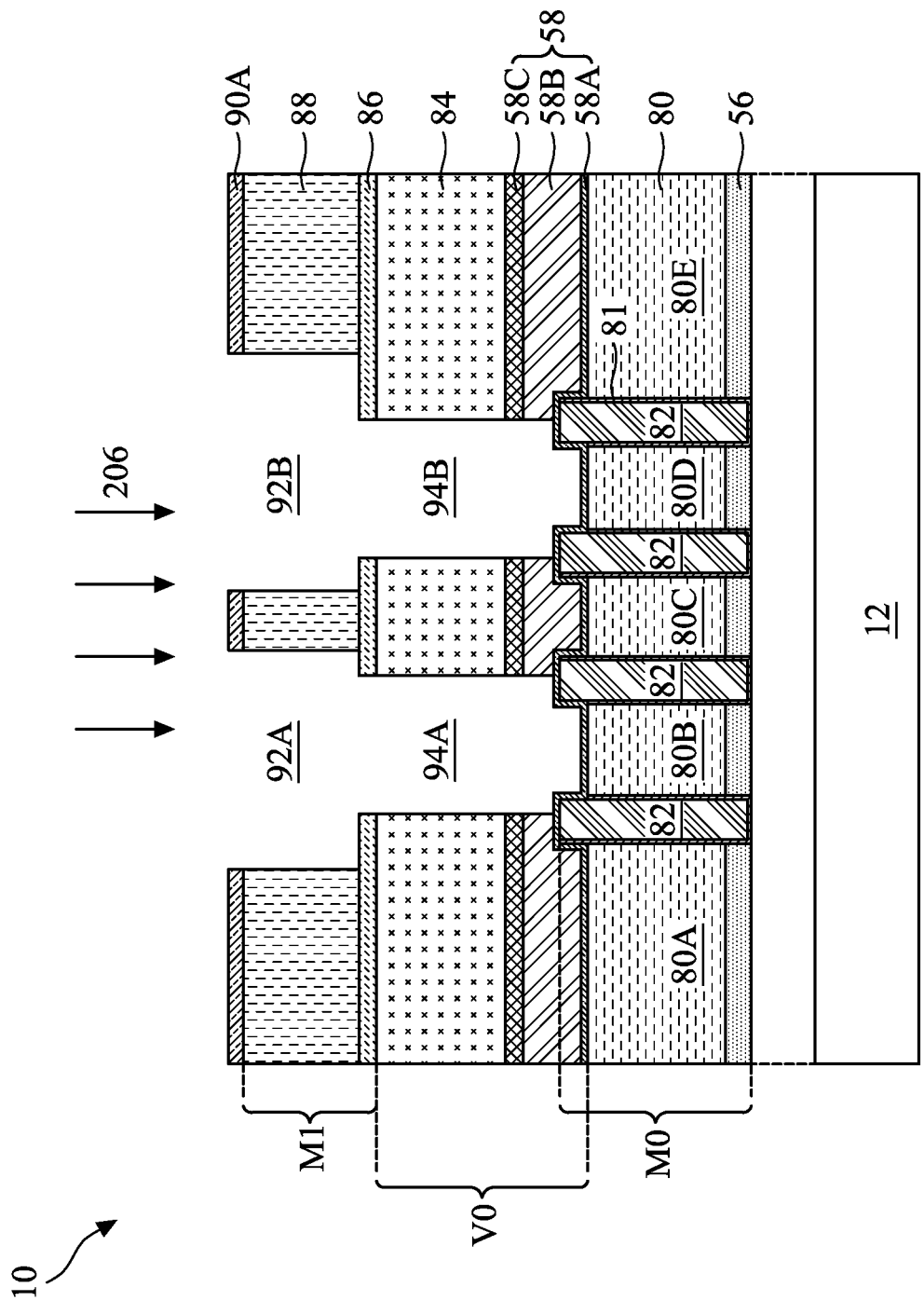

Referring to FIGS. 1B and 13, method 100 at operation 120 selectively removes the exposed portions of ESL 58B in an etching process 206. In the present embodiments, etching process 206 is a dry etching process (e.g., an RIE process) that implements a suitable etchant for selectively removing exposed portions of ESL 58B without removing, or substantially removing, the underlying ESL 58A. In some embodiments, etching process 206 implements a fluorine-containing gas (e.g., $CF_4$, $SF_6$, $CH_2F_2$, $CHF_3$, $C_4F_8$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an oxygen-containing gas (e.g., $O_2$), other suitable gases, or combinations thereof. In the present embodiments, etching process 206 implements an etchant that is different from that of etching process 202. Additionally, one or more parameters of etching process 206 may also differ from those of etching process 202. In the present embodiments, the etching selectivity between ESLs 58A and 58B enables etching process 206 to stop on (or exposes) ESL 58A.

Figure 14:
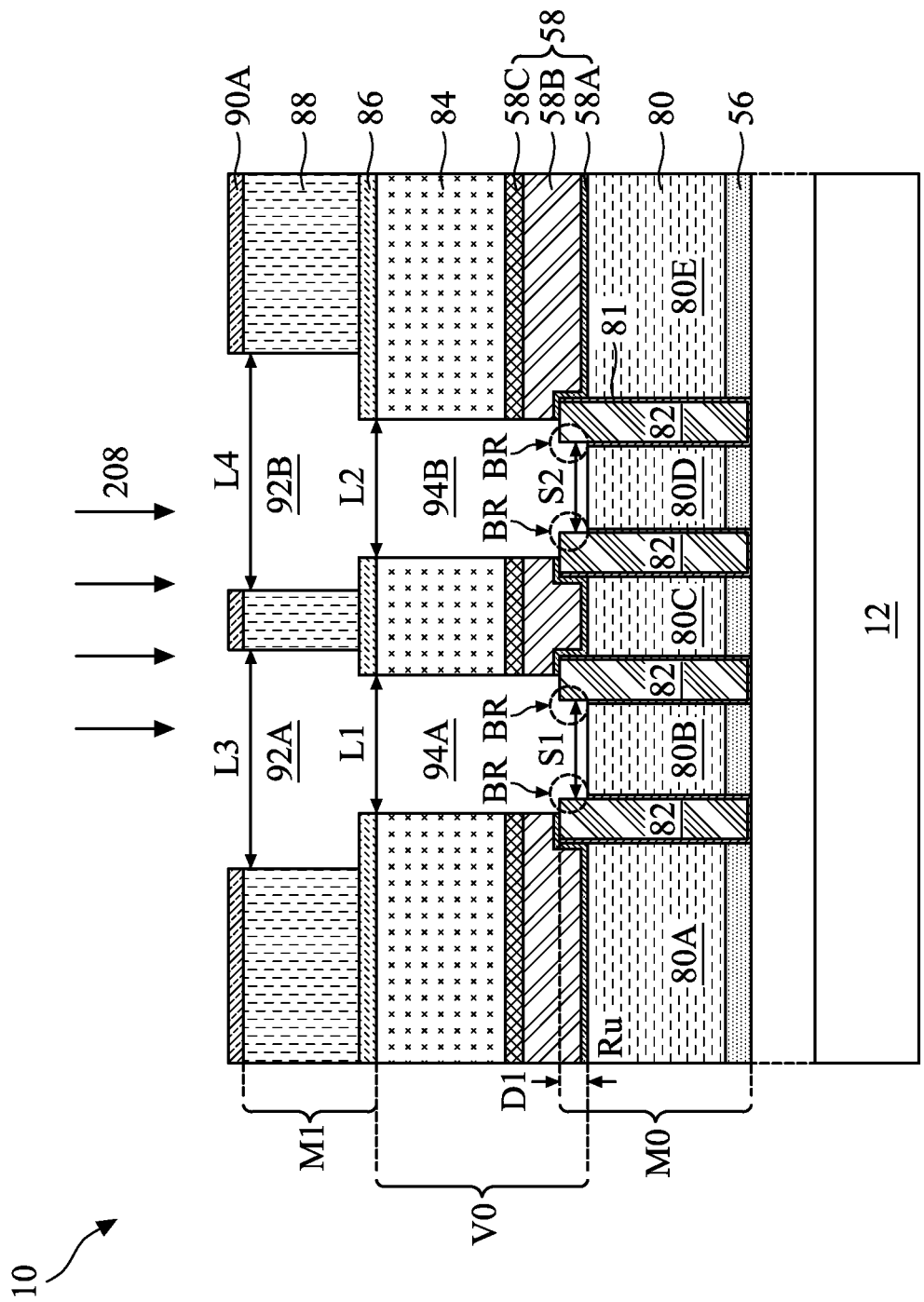

Referring to FIGS. 1B and 14, method 100 at operation 122 removes the exposed portions of ESL 58A in an etching process 208, thereby extending trenches 94A and 94B to expose one or more of metal lines 80A-80E. In the present embodiments, etching process 208 implements a wet etchant that includes, for example, hydrofluoric acid (HF), ammonium fluoride ($NH_4F$), hydrogen peroxide ($H_2O_2$), other suitable etchants, or combinations thereof. For embodiments in which ESLs 58A and 58C have the same composition, etching process 208 implements the same etchant as etching process 204.

In the present embodiments, etching process 208 vertically extends trenches 94A and 94B downward, such that a bottom surface of trench 94A is defined by width 51 and a bottom surface of trench 94B is defined by width S2. In other words, etching process 208 is implemented in a self-aligned fashion to ensure contact between metal lines 80A-80E and the subsequently-formed via contacts in trenches 94A and 94B. As depicted herein, etching process 208 may also remove portions of dielectric capping layer 81 exposed in trenches 94A and 94B, thereby exposing at least portions of dielectric features 82. In such instances, any misalignment during the patterning of trenches 94A and 94B with respect to metal lines 80A-80E may inadvertently remove portions of dielectric features 82. For existing implementations in which zeroth metallization layer M0 includes a substantially flat top surface (see FIG. 3B), such inadvertent etching creates a recess adjacent to the metal lines, such that the subsequent filling of trenches 92A, 92B, 94A, and 94B with a conductive material also fills the recess, forming a tooth-like defect adjacent to the metal lines. As a result, device performance such as reliability (e.g., measured by timedependent dielectric breakdown, or TDDB) may suffer. In contrast, because dielectric features 82 of the present embodiments protrude above metal lines 80A-80E, they provide a buffering region BR (indicated by dotted circles in FIG. 14) for the metal lines in the event that any accidental over-etching of dielectric features 82 occurs due to patterning misalignment.

Figure 15:
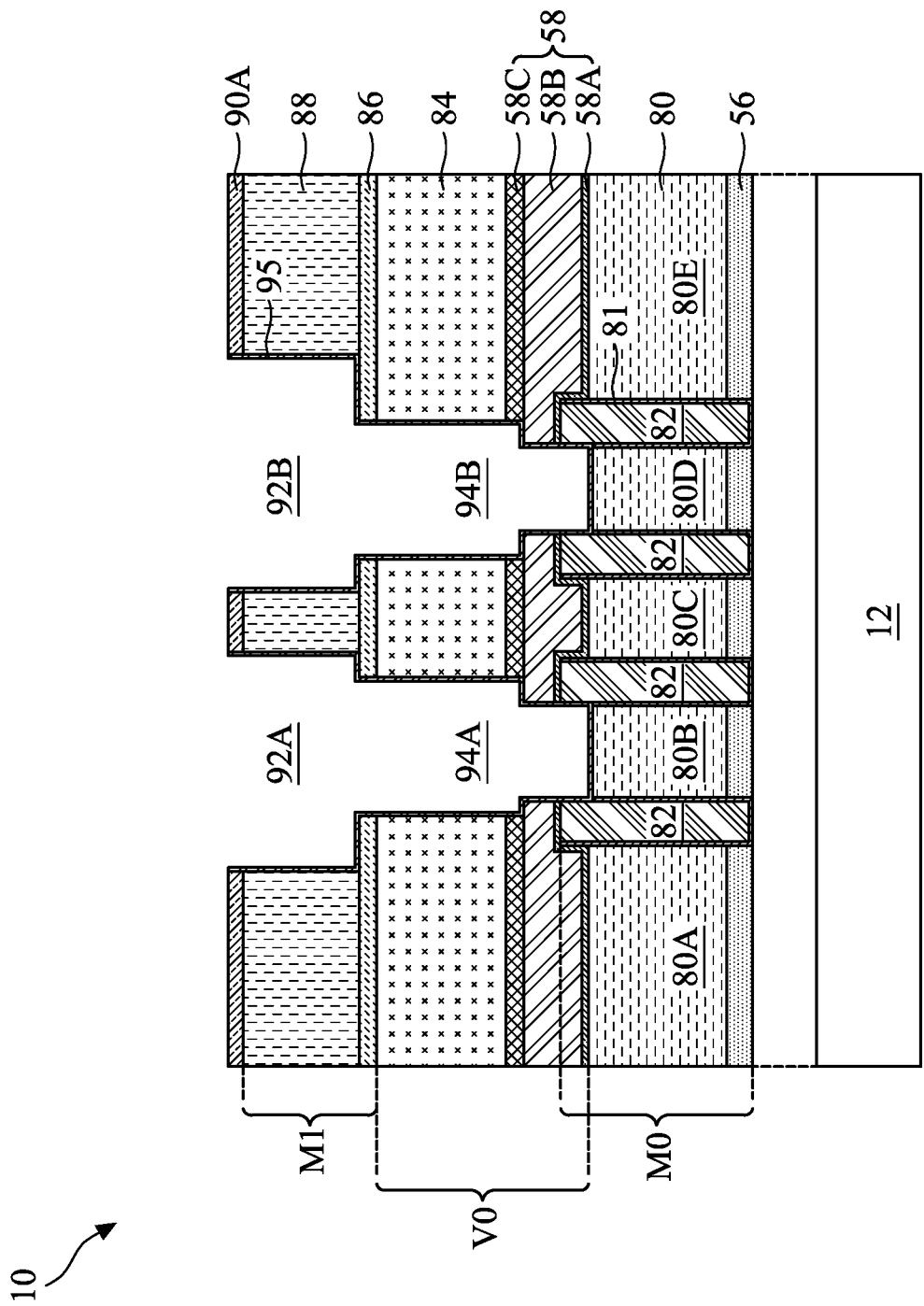

Subsequently, referring to FIGS. 1B and 15 to 17, method 100 at operation 124 form via contacts 97A and 97B in trenches 94A and 94B and metal lines 98A and 98B in trenches 92A and 92B. Referring to FIG. 15, method 100 first conformally forms a barrier layer 95 in trenches 92A, 92B, 94A, and 94B, such that portions of barrier layer 95 are in direct contact with one or more of metal lines 80A-80E. In the present embodiments, barrier layer 95 includes a metal nitride, such as TiN, TaN, other materials, or combinations thereof, and is deposited by any suitable method, such as ALD, CVD, other methods, or combinations thereof.

Figure 16:
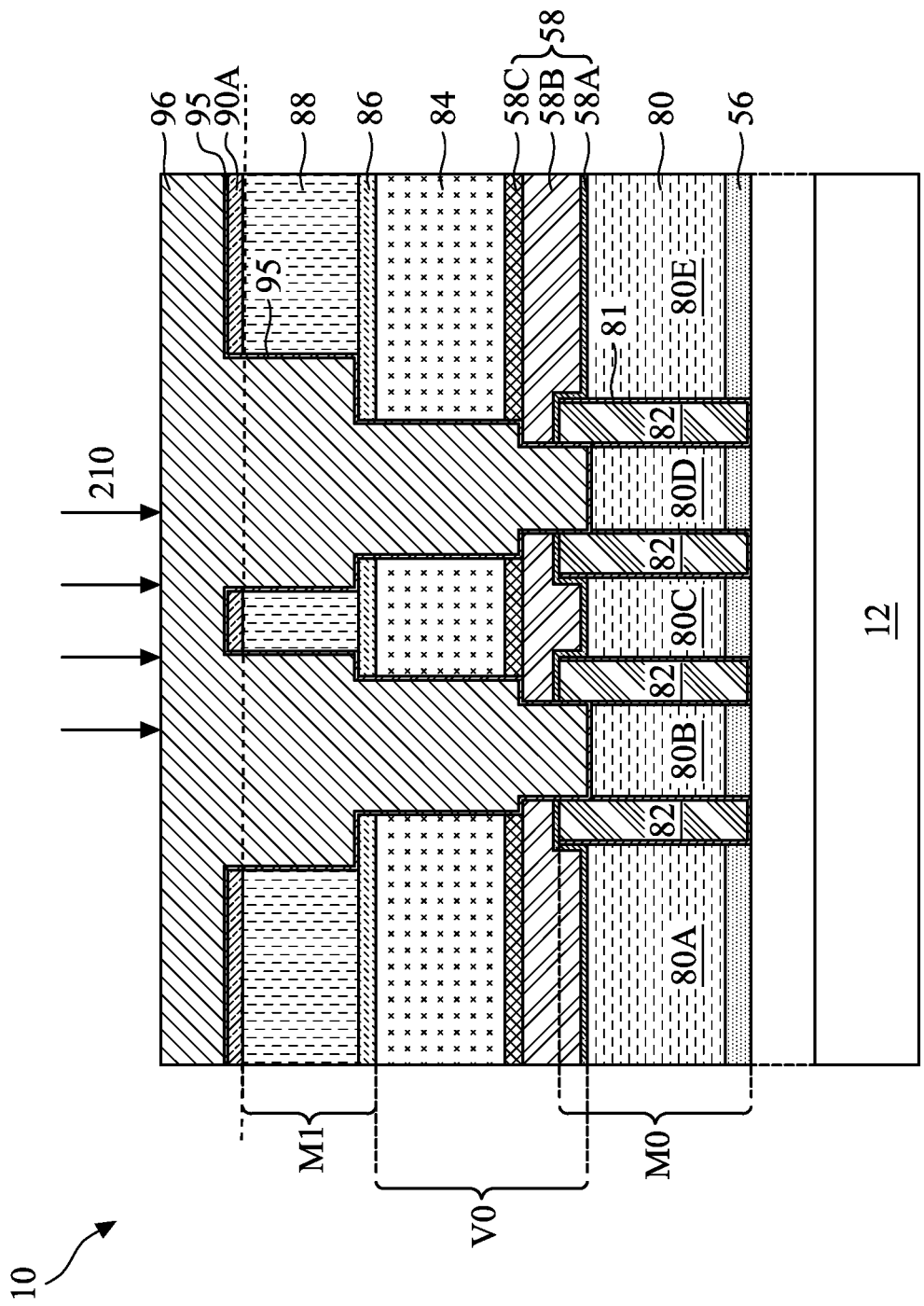

Thereafter, referring to FIG. 16, method 100 deposits a conductive material 96 over barrier layer 95 to fill trenches 92A, 92B, 94A, and 94B. Conductive material 96 may include a suitable conductive material, such as Cu, Co, W, Al, Ru, other suitable conductive materials, or combinations thereof, and may be deposited by any suitable method, such as CVD, PVD, ALD, plating (e.g., electro-chemical plating (ECP)), other methods, or combinations thereof. For embodiments in which conductive material 96 includes Cu, a seed layer (not depicted) is first deposited in trenches 92A, 92B, 94A, and 94B before depositing conductive material 96 by a suitable method, such as ECP. Subsequently, portions of barrier layer 95 and conductive material 96 formed over the patterned bottom layer 90A of HM 90 are removed by one or more CMP processes 210 along the dotted line depicted in FIG. 16, thereby completing the formation of first metallization layer M1 and zeroth via contact V0 over zeroth metallization layer M0. In the present embodiments, the presence of the patterned bottom layer 90A facilitates the CMP processes 210 and provides structural support for the underlying ILD layer 88. In the depicted embodiments, portions of the sidewalls of via contacts 97A and 97B are defined by dielectric features 82 due to their protruding above metal lines 80A-80E.

Referring to FIG. 1B, method 100 at operation 126 performs further fabrication processes to the IC device 10. For example, method 100 may form additional metal lines in metal layer Mx (where x is an integer greater than one) similar to first metallization layer M1, additional via contacts in via layers Vx (where x is an integer greater than zero), passivation layers, other BEOL features, or combinations thereof to complete fabrication of the IC device 10.

Although not intended to be limiting, one or more embodiments of the present disclosure provide many benefits to a semiconductor device and the formation thereof. For example, embodiments of the present disclosure provide a method of forming a metal line and a via contact by sandwiching a patterned ESL that defines the dimension of a via contact between two ILD layers, which are subsequently etched to form a first trench providing a metal line in the top ILD layer interconnected to a second trench providing the via contact in the bottom ILD layer. In other words, the dimension of the via contact is controlled by the opening(s) pre-defined in the patterned ESL, allowing more precise control of the etching process to result in substantially vertical sidewalls of the trench for the via contact. Such improved sidewall profile for the via contact reduces the need to perform extended etching process that is otherwise desired to ensure that the dimension of the trench provides sufficient contact area between the via contact and the underlying conductive feature(s) (e.g., a lower metal line). Furthermore, the method for forming interconnect structures can be easily integrated into existing semiconductor fabrication processes.

In one aspect, the present disclosure provides a method that includes forming a first conductive feature over a substrate, forming an ESL stack over the first conductive feature, forming a first ILD layer over the ESL stack, and forming a patterned ESL over the first ILD layer, wherein the patterned ESL includes a first opening. The method further includes forming a second ILD layer over the patterned ESL, thereby filling the first opening, forming a patterned HM over the second ILD layer, where the patterned HM includes a second opening and where a width of the second opening is greater than a width of the first opening, performing an etching process to form a first trench in the second ILD layer and a second trench in the first ILD layer, where the second trench exposes the first conductive feature, and subsequently depositing a conductive layer in the first trench and the second trench, thereby forming a second conductive feature in the second trench and a third conductive feature in the first trench, where the second conductive feature interconnects the first conductive feature to the third conductive feature.

In another aspect, the present disclosure provides a method that includes forming a first metallization layer over a substrate, forming a via contact over the first metallization layer, and forming a second metallization layer over the via contact. In the present embodiments, forming the via contact and the second metallization layer includes depositing a first ESL over the first metallization layer, depositing a second ESL over the first ESL, depositing a third ESL over the second ESL, where the second ESL differs from the first ESL and the third ESL in composition, depositing a first ILD layer over the third ESL, and forming a patterned fourth ESL over the first ILD layer. Forming the via contact and the second metallization layer further includes depositing a second ILD layer over the patterned fourth ESL, such that the second ILD layer extends through the patterned fourth ESL to contact the first ILD layer, forming a patterned HM over the second ILD layer, forming a trench that extends through the second ILD layer, the first ILD layer, the third ESL, the second ESL, and the first ESL using the patterned HM and the patterned fourth ESL as etch masks, such that the trench exposes a portion of the first metallization layer, depositing a conductive layer in the trench, and planarizing the conductive layer to form the via contact in the first ILD layer and the second metallization layer in the second ILD layer, where the via contacts interconnects the second metallization layer to the first metallization layer.

In yet another aspect, the present disclosure provides a method that includes forming a first conductive layer over a substrate, patterning the first conductive layer to form a first trench adjacent to a first conductive feature, forming a first ILD layer in the first trench, where the first ILD layer protrudes from a top surface of the first conductive feature, forming an ESL stack over the first conductive feature and the ILD layer, forming a second ILD layer over the ESL stack, and forming a patterned ESL over the first ILD layer, where the patterned ESL includes a first opening. The method further includes forming a third ILD layer over the patterned ESL, thereby filling the first opening, forming a patterned HM over the second ILD layer, where the patterned HM includes a second opening and where the second opening is wider than the first opening, forming a trench that extends through the second ILD layer, the patterned ESL, and the first ILD layer to expose portions of the ESL stack, extending the trench through the ESL stack, thereby exposing the first conductive feature, and depositing a second conductive layer in the trench, thereby forming a second conductive feature in the second ILD layer and a third conductive feature in the third ILD layer, where the second conductive feature interconnects the first conductive feature to the third conductive feature and where portions of sidewalls of the third conductive feature are defined by the first ILD layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    forming a first conductive feature over a substrate;
    forming first and second dielectric features on sidewalls of the first conductive feature, the first and the second dielectric features include protruding portions that extend above a top surface of the first conductive feature;
    forming an etch-stop layer (ESL) stack of a dielectric material over the first conductive feature and on the protruding portions of the first and the second dielectric features, the dielectric material includes a same material continuously interfacing a top surface of the first conductive feature and top and sidewall surfaces of the protruding portions, the ESL stack having a continuous planar top surface spanning above the first conductive feature and the protruding portions;
    forming a first interlayer dielectric (ILD) layer over the ESL stack;
    forming a patterned ESL over the first ILD layer, wherein the patterned ESL includes a first opening;
    forming a second ILD layer over the patterned ESL, thereby filling the first opening;
    forming a patterned hard mask (HM) over the second ILD layer, wherein the patterned HM includes a second opening, and wherein a width of the second opening is greater than a width of the first opening;
    performing a first etching process to form a first trench in the second ILD layer and a second trench in the first ILD layer using the patterned ESL as an etch mask;
    performing a second etching process to form a third trench exposing a top surface of the first conductive feature, wherein the second etching process includes a first etching step that etches a top portion of the ESL stack to expose a bottom portion of the ESL stack, the first etching step includes applying a wet etch followed by a dry etch, the exposed bottom portion having a uniform conformal thickness with uneven top surfaces, wherein the second etching process includes a second etching step that removes the exposed bottom portion of the ESL stack, wherein a distance between the first and the second dielectric feature is smaller than a width of the second trench such that the second trench exposes the first conductive feature; and
    depositing a conductive layer in the first trench, the second trench, and the third trench, thereby forming a second conductive feature in the second and third trenches and a third conductive feature in the first trench, wherein the second conductive feature interconnects the first conductive feature to the third conductive feature.

2. The method of claim 1, wherein forming the first conductive feature includes:
    depositing a metal layer over the substrate;
    forming a capping layer over the metal layer;
    patterning the capping layer and the metal layer to form a third trench;
    depositing a dielectric layer in the third trench; and
    selectively removing the capping layer from the metal layer, such that the dielectric layer protrudes from a top surface of the first conductive feature.

3. The method of claim 1, wherein forming the ESL stack includes:
    depositing a first ESL over the first conductive feature;
    depositing a second ESL over the first ESL; and
    depositing a third ESL over the second ESL, wherein the second ESL has a composition different from that of the first ESL and the third ESL.

4. The method of claim 3, wherein the first ESL and the third ESL have the same composition.

5. The method of claim 3, wherein the patterned ESL has the same composition as the first ESL or the third ESL.

6. The method of claim 1, wherein the first opening in the patterned ESL defines a dimension of the second conductive feature, and wherein the second opening in the patterned HM defines a dimension of the third conductive feature.

7. The method of claim 1, wherein performing the etching process results in an angle between a sidewall surface and a bottom surface of the second trench is at least about 80°.

8. The method of claim 1, wherein the second etching step is a wet etching process that further removes portions of a dielectric cap layer exposed in the third trench and surrounding the first and second dielectric features.

9. The method of claim 1, wherein the first opening is directly under the second opening.

10. A method of forming a semiconductor structure, comprising:
    forming a first metallization layer over a substrate;
    patterning the first metallization layer to form isolation trenches in the first metallization layer;
    forming dielectric separators in the isolation trenches to form a first conductive feature sandwiched between the dielectric separators;
    depositing an etch-stop layer (ESL) stack on the first metallization layer and on the dielectric separators, the ESL stack having a continuous planar top surface above top surfaces of both the first conductive feature and the dielectric separators;
    depositing a first interlayer dielectric (ILD) layer over the ESL stack;
    forming a patterned ESL over the first ILD layer, wherein the patterned ESL has an opening directly above the first conductive feature, and the opening is wider than the first conductive feature;
    depositing a second ILD layer over the patterned ESL, such that the second ILD layer extends through the opening of the patterned ESL to contact the first ILD layer;
    forming a patterned hard mask (HM) over the second ILD layer;

forming a first trench that extends through the second ILD layer and the first ILD layer but not through the ESL stack;

after forming the first trench, forming a second trench to selectively remove the ESL stack to expose the first conductive feature, wherein the forming of the second trench includes performing alternating wet and dry etch processes, and one of the wet etch processes removes portions of a dielectric cap layer exposed in the second trench and surrounding the dielectric separators;

depositing a conductive layer in the first trench and the second trench; and planarizing the conductive layer to form a via contact in the first ILD layer and a second metallization layer in the second ILD layer, wherein the via contact interconnects the second metallization layer to the first metallization layer.

11. The method of claim 10, wherein the depositing of the ESL stack includes forming a silicon-rich polymer material.

12. The method of claim 10, wherein the patterned ESL has an opening directly above a metal line of the first metallization layer.

13. The method of claim 10, wherein the forming of the first trench includes:

performing a first dry etching process to remove portions of the second ILD layer and the first ILD layer exposed through the patterned HM and the patterned ESL, respectively, thereby exposing portions of the ESL stack;

wherein the forming of the second trench includes:

performing a first wet etching process to selectively remove a top exposed portion of the ESL stack, thereby exposing a middle portion of the ESL stack;

performing a second dry etching process to selectively remove the exposed middle portions of the ESL stack, thereby exposing bottommost portions of the ESL stack; and performing a second wet etching process to selectively remove the exposed bottommost portions of the ESL stack.

14. The method of claim 13, wherein the first wet etching process and the second wet etching process each implement hydrofluoric acid (HF), ammonium fluoride ($NH_4F$), hydrogen peroxide ($H_2O_2$), or combinations thereof.

15. A method of forming a semiconductor structure, comprising:

forming a first conductive layer over a substrate;

patterning the first conductive layer to form a first conductive feature and a first trench adjacent to the first conductive feature;

forming a dielectric layer in the first trench, the dielectric layer protrudes from a top surface of the first conductive feature;

forming an etch-stop layer (ESL) stack over the first conductive feature, wherein the ESL stack includes a material that continuously conform to a top surface of the first conductive feature and top and sidewall surfaces of the dielectric layer, wherein the ESL stack has a continuous planar top surface spanning above the first conductive feature and the dielectric layer;

forming a first interlayer dielectric (ILD) layer over the ESL stack;

forming a patterned ESL over the first ILD layer, wherein the patterned ESL includes a first opening;

forming a second ILD layer over the patterned ESL, thereby filling the first opening;

forming a patterned hard mask (HM) over the second ILD layer, wherein the patterned HM includes a second opening, and wherein the second opening is wider than the first opening;

forming a trench by first etching through the second ILD layer and the first ILD layer using the patterned HM and patterned ESL as etch masks and the ESL stack as an etch stop, wherein the first etching includes performing a single dry etch process;

after forming the trench, extending the trench by second etching through the ESL stack, thereby exposing the top surface of the first conductive feature, wherein the second etching includes performing alternating wet and dry etch processes; and depositing a second conductive layer in the trench, thereby forming a second conductive feature in the first ILD layer and a third conductive feature in the second ILD layer, wherein the second conductive feature interconnects the first conductive feature to the third conductive feature, and wherein portions of sidewalls of the third conductive feature are defined by the second ILD layer.

16. The method of claim 15, wherein the extending of the trench through the ESL stack includes:

performing a first wet etching process to selectively remove a top portion of the ESL stack;

performing a second dry etching process to selectively remove a middle portion of the ESL stack; and performing a second wet etching process to selectively remove a bottom portion of the ESL stack, thereby exposing the first conductive feature.

17. The method of claim 15, wherein the first opening is wider than a width of the first conductive feature.

18. The method of claim 15, wherein an angle between sidewalls and a bottom surface of the trench formed in the first ILD layer is at least about 80°.

19. The method of claim 1, wherein the performing of the first etching process includes performing a first dry etching to remove portions of the second ILD layer and the first ILD layer exposed through the patterned HM and the patterned ESL, wherein the wet etch of the first etching step is a first wet etching process, the dry etch of the first etching step is a second dry etching process, and the second etching step is a second wet etching process, and the performing of the second etching process includes performing the first wet etching process, the second dry etching process after the first wet etching process, and the second wet etching process after the second dry etching process to collectively etch through the ESL stack.

20. The method of claim 15, wherein the second etching through the ESL stack includes a first etching step that etches a top portion of the ESL stack to expose a bottom portion of the ESL stack, the exposed bottom portion having a uniform conformal thickness with uneven top surfaces, wherein the second etching process includes a second etching step that removes by wet etching the exposed bottom portion of the ESL stack and portions of a dielectric cap layer exposed in the extended trench and surrounding the dielectric layer.

* * * * *